(12) United States Patent
Wang et al.

(10) Patent No.: US 6,377,410 B1
(45) Date of Patent: Apr. 23, 2002

(54) OPTICAL COUPLING SYSTEM FOR A HIGH-POWER DIODE-PUMPED SOLID STATE LASER

(75) Inventors: Zhijiang Wang, Diamond Bar; Alice Z. Gheen, Irvine; Ying Wang, Diamond Bar, all of CA (US)

(73) Assignee: Apollo Instruments, Inc., Irvine, CA (US)

( * ) Notice: Subject to any disclaimer, the term of this patent is extended or adjusted under 35 U.S.C. 154(b) by 0 days.

(21) Appl. No.: 09/410,417

(22) Filed: Oct. 1, 1999

(51) Int. Cl.[7] .......................... H01S 3/091; H01S 3/094; G02B 5/04
(52) U.S. Cl. .......................... 359/837; 372/75; 385/33; 385/36; 359/850
(58) Field of Search .......................... 372/9, 27, 109, 372/75, 71; 359/831–837, 129, 855–861, 629–640; 385/31–50, 15, 129–132

(56) References Cited

U.S. PATENT DOCUMENTS

| | | | |
|---|---|---|---|
| 5,229,883 A | * | 7/1993 | Jackson et al. ............. 359/569 |
| 5,805,748 A | * | 9/1998 | Izawa .......................... 385/15 |
| 5,887,096 A | * | 3/1999 | Du et al. ...................... 385/39 |
| 6,028,722 A | * | 2/2000 | Lang ........................... 359/834 |
| 6,101,199 A | * | 8/2000 | Wang et al. .................. 372/6 |

\* cited by examiner

Primary Examiner—James W. Davie
Assistant Examiner—Davienne Monbleau
(74) Attorney, Agent, or Firm—Townsend and Townsend and Crew LLP

(57) ABSTRACT

Method and apparatus are disclosed for beam dividing and shaping, in which the beams from laser diode array are divided in a plurality of sections along the slow axis and the sections of beams are then recombined along their fast axis so that the Lagrange invariant of the resulting beam increased approximately by n-fold in fast axis and reduced approximately by n-fold in slow axis. With the inclusion of above apparatus in diode laser modules, the main objectives of constructing high-efficiency solid state lasers can be achieved. Thus, a high-efficiency diode-pumped solid state laser apparatus can be made, comprising a laser fiber, at least one laser diode array module, an imaging optical system, wherein said imaging optical system is disposed between said module and the aperture of said fiber and focuses the beam from said module onto the aperture of said laser fiber, and wherein said laser diode array module comprises at least one laser diode array, a collimating structure, a beam dividing/rearranging device and an optical relay system.

20 Claims, 25 Drawing Sheets

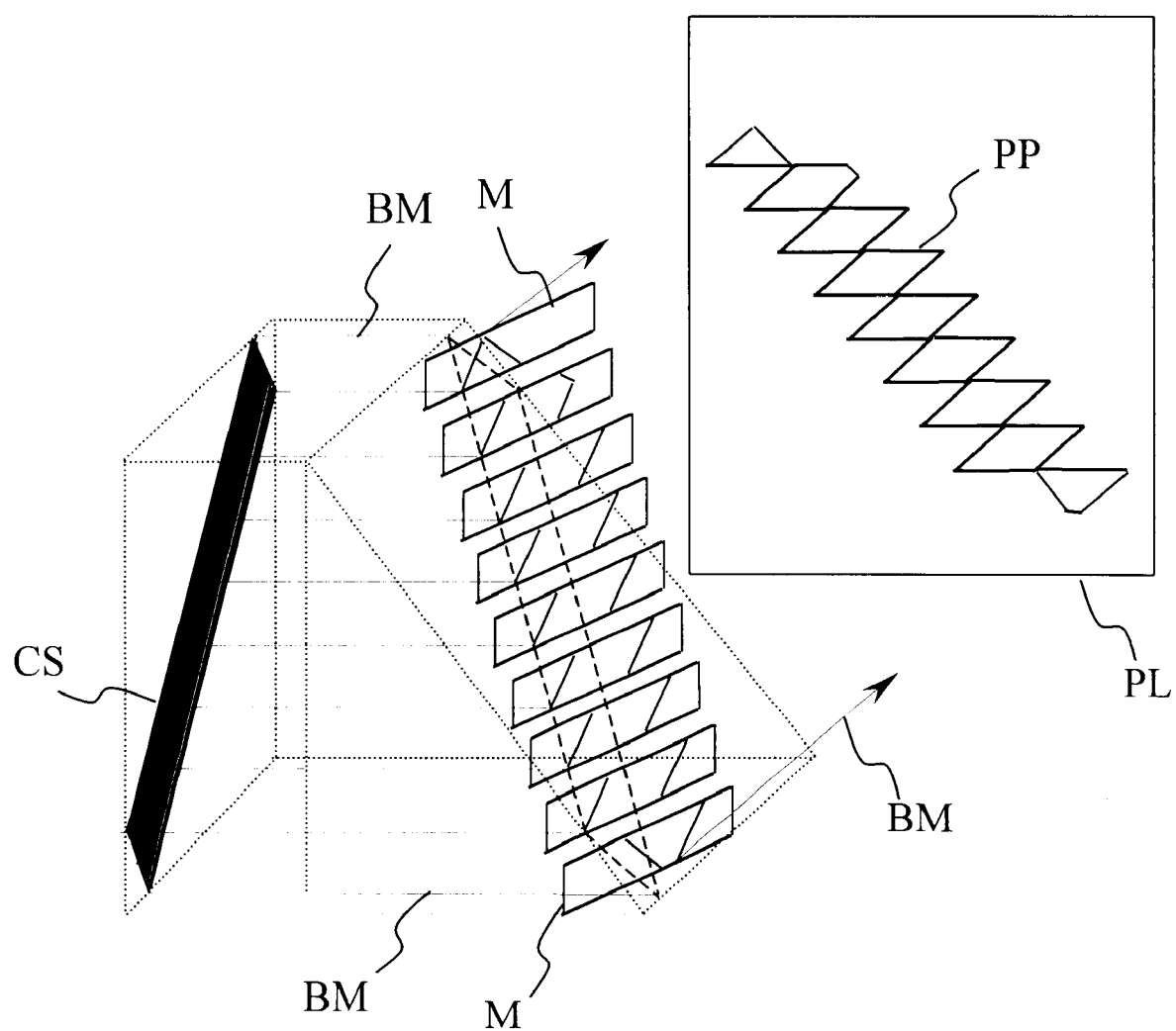
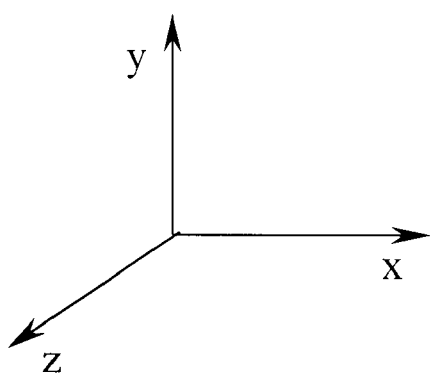
*Fig. 3*

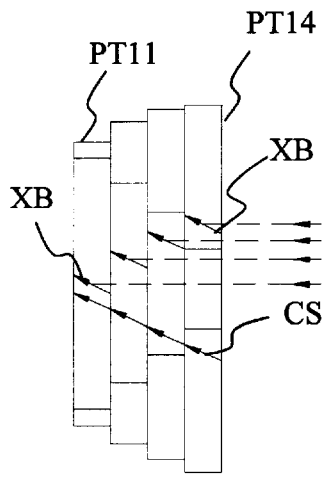
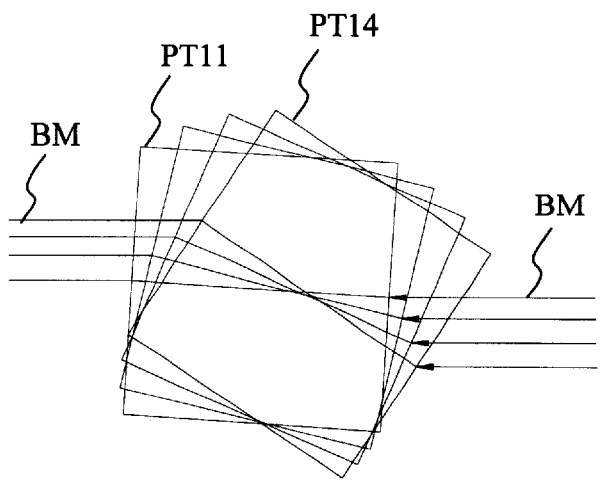
*Fig. 6(a)*     *Fig. 6(b)*
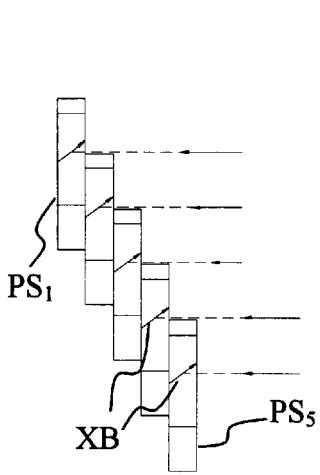
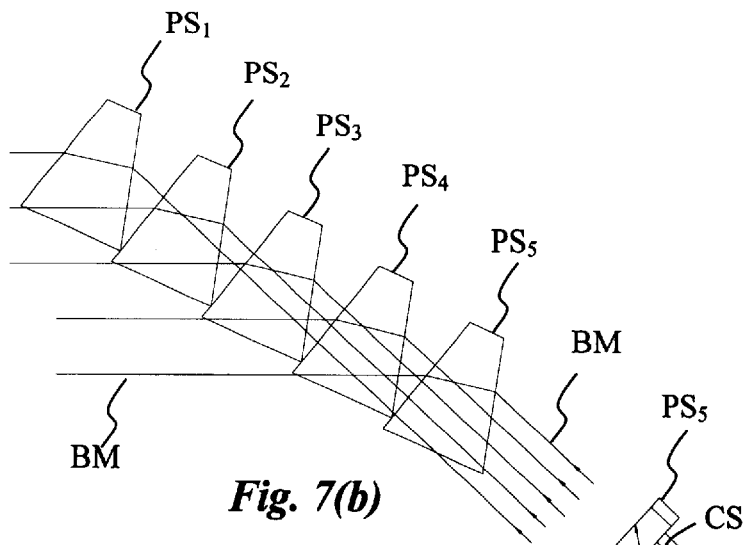
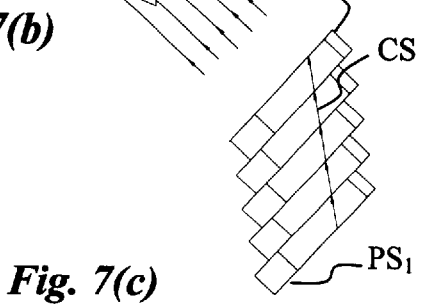
*Fig. 7(a)*     *Fig. 7(b)*     *Fig. 7(c)*

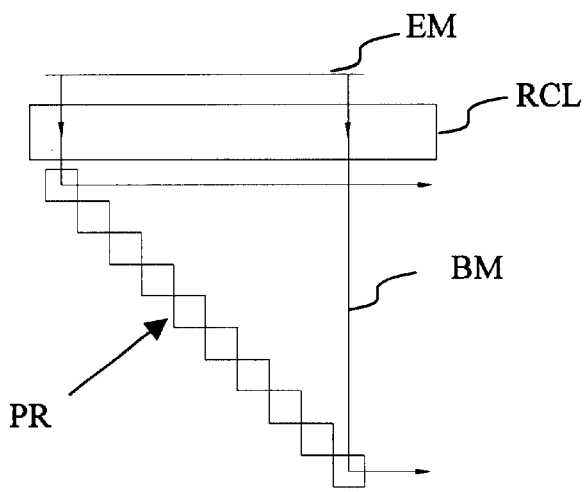
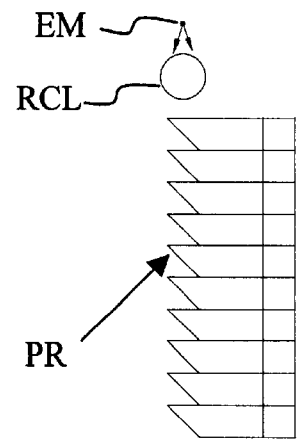
*Fig. 12(a)*
*Fig. 12(b)*
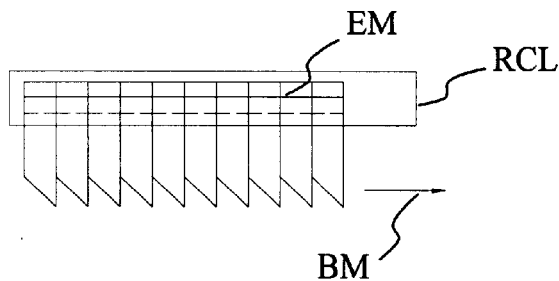
*Fig. 12(c)*
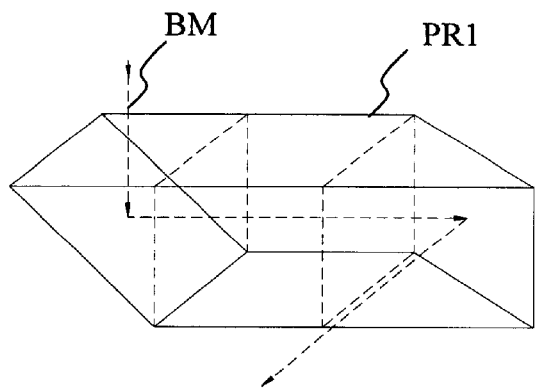
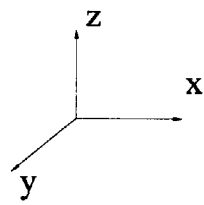
*Fig. 12(d)*

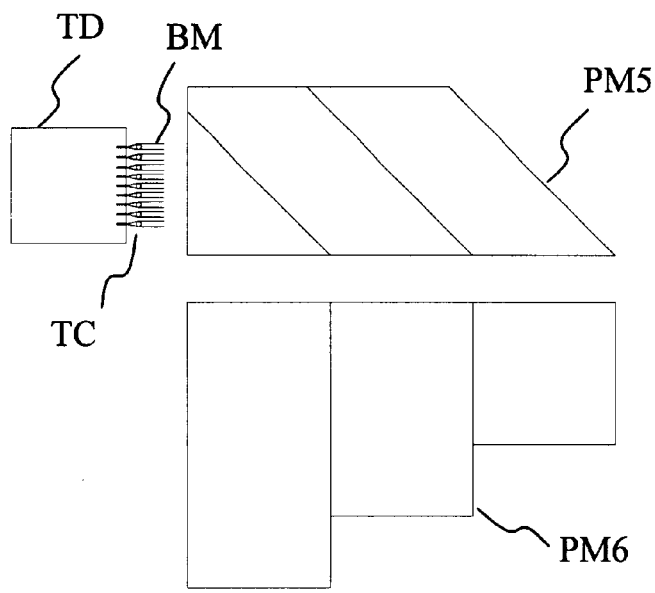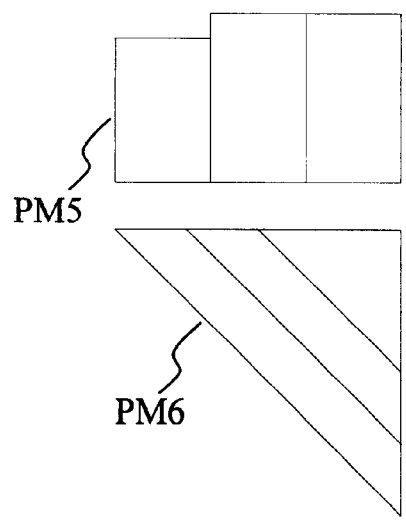
*Fig. 13(a)* *Fig. 13(b)*

*Fig. 13(c)* *Fig. 13(d)* *Fig. 13(e)*

*Fig. 13(f)* *Fig. 13(g)* *Fig. 13(h)*

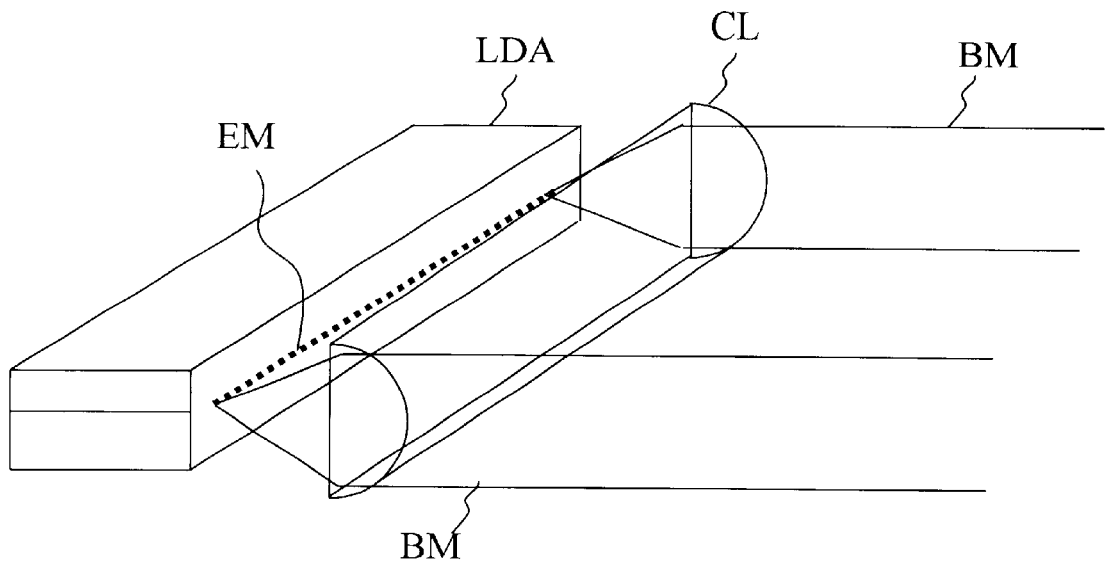
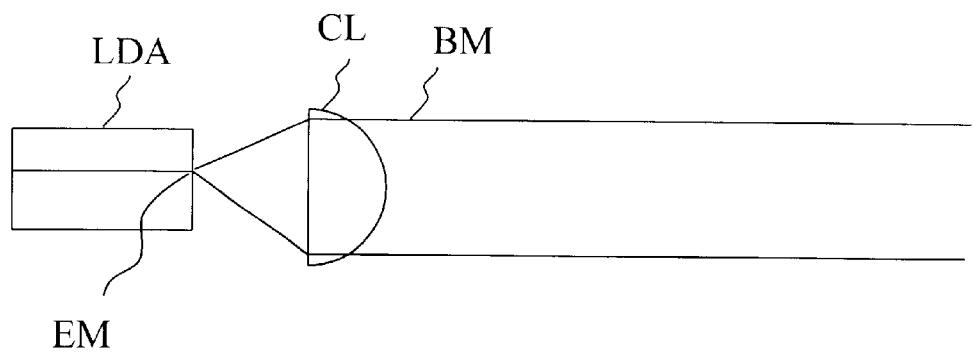
*Fig. 15*

OPTICAL COUPLING SYSTEM FOR A HIGH-POWER DIODE-PUMPED SOLID STATE LASER

BACKGROUND OF THE INVENTION

1. Technical Field

The present invention relates to optical coupling systems for coupling semiconductor laser with optical fiber and in particular relates to methods for diode-laser beam shaping for construction of high-efficiency and high-power solid state lasers including fiber lasers, and for high efficiency transmission of diode laser power through optical fiber.

2. Background Art

The development of diode pumped fiber lasers has been rather successful recently. The scaling of various physical effects has greatly benefited this development. Diode lasers can provide concentrated pumping energy and thus enhance the efficiency of fiber lasers. The long thin geometry of fiber also makes heat removal much easier than in bulk solid state lasers. In end-pumped fiber lasers a large outer cladding is used in cladding pumping. Pump light, often piped through fibers from pump lasers, enters the outer core, where it is confined so that it passes through the inner core, exciting the laser species. Stimulated emission from the laser species remains in the inner core. By converting the low brightness beam from the pump diode bar into a tighter beam pumping a fiber laser can multiply brightness by a factor of more than 1000. By using such configuration, Polaroid, for example, reported a diode cladding pumping fiber laser reaching 35 W.

Currently, a typical fiber laser device includes a tens-of-meters double clad silica fiber with a small diameter and small NA core doped with active species, centered within a much larger inner cladding, surrounded by a soft low index fluoropolymer providing an acceptance NA of 0.45 for pump radiation. Pumping laser beams from laser diodes are coupled into the fiber inner cladding through the dichroic end mirror. (HR laser, HT pump). Among other things, the cladding pumping geometry and the coupling efficiency of pumping laser diode array are the main factors under intense research. Proper geometry is essential for increasing the efficiency of cladding pumping. Good method of coupling will allow more diode laser power to be injected into the fiber laser, which in turn also increase the efficiency of a fiber laser.

A typical high-power laser diode array (LDA) has an a broad area light emitting aperture (1 cm×1 $\mu$m) comprising light emitting elements which are multiple spaced apart segments. In one typical commercial LDA product, for example, each segment has a width less than 200 $\mu$m, and may be divided into 20 sub-segments. Each sub-segment has an aperture width of 3–6 $\mu$m, and emits about 30 mW–60 mW. The effective aperture size in the transverse direction perpendicular to the plane of laser active region (the fast axis) is about 1 $\mu$m. Typical fast axis divergence is 30–40 degree and slow axis divergence is 10–15 degree. A typical high-power LDA can deliver 20 W laser power. Those more powerful can deliver 40 W or 60 W with this geometry. By using diode array stacks, however, 500–1400 W can be obtained. Because of the elongated geometry of LDA, it has been always a challenge to couple or inject high power (such as 4000 W) into a fiber cladding aperture (such as an aperture of 200 $\mu$m×500 $\mu$m, NA 0.45).

In order to send more power into optical fiber, many efforts have been made to concentrate light from diode laser arrays. There are a number of patents dealing with concentrating multiple emitter laser diode beams, such as U.S. Pat. Nos. 5,887,096, 5,825,551, 5,808,323, 5,805,748, 5,513,201, and PCT WO99/35724, and PCT97/14073. Some other disclosures are shown in U.S. Pat. Nos. 5,802,092, 5,793,783, 5,790,310, 5,594,752, 5,579,422, 5,568,577, 5,333,077, 5,185,758, 5,139,609, and 4,428,647.

In U.S. Pat. No. 5,887,096, an arrangement in which a reflection lens system shapes and guides beams from a rectilinear laser diode array with beam outlet surfaces lying in a common plane is disclosed. In order to map the beams from the individual laser diodes to form a substantially uniform radiation field or pattern using such an arrangement, at least one first reflection component having a reflection surface is associated with each beam in order to bring together the individual outlet beams. The reflection surfaces are disposed in mutually offset planes, the offset corresponding sequentially to the sequence of the laser diodes in the array. And it has been found advantageous for at least one second, additional reflecting surface to be assigned to each first reflecting surface and placed in the beam path of each beam emerging from a laser diode. In U.S. Pat. Nos. 5,825,551, 5,808,323, 5,805,748, different laser beam shaping systems are disclosed. With these methods, an elongated laser beam is divided into a plurality of beam sections that is then rearranged into a more circular cross-section more suitable for pumping. Thus, beam dividing and rearrangement is achieved in these Patents using two parallel mirrors, using multiple small mirrors, or using multiple refractive parallel plates, respectively. In PCT WO97/14073, Hollemann et al shows a device for combining and shaping the radiation from several laser diode cells consisting of at least two laser diodes. For the systems discussed in the above disclosures, the requirements in system alignment can be difficult to meet in practice. In U.S. Pat. No. 5,805,323, a single row of mirrors is also used to shape the beams from a laser diode array to a parallelogram-shaped laser beam bundle. But the mirror is difficult to realize in practice. In U.S. Pat. No. 5,513,201, an optical-path rotating device comprising a group of complicated prisms is disclosed. In PCT 99/35724 and in an earlier publication (SPIE Proceedings Vol. 3,008,202, 1997), Goring et al disclosed an optical system for symmetrizing the beam of one or more superimposed high-power diode laser by using refraction components. A common feature of the prior art is that one reflection component is associated with each beam from the diode laser array. This leads to low flexibility and difficulty in manufacturing. In U.S. Pat. No. 4,428,647, Spragne et al disclose systems in which each laser emitter of a diode laser array has its own lens mount adjacent to it in the space between the laser array and objective lens of the system. The purpose of the lens array is to change the angle of divergence of light beams leaving the emitting surface of the laser array at the slow axis so that the light beam can be collected efficiently by the objective lens. In U.S. Pat. No. 5,185,758, Fan et al describe a method for scaling a pumped medium to higher power with multiple light source. The output beam of each light source is substantially collimated by respective collimating optics, and the beams of sources are substantially parallel to each other after collimation. An optical system is provided to focus the collimated and parallel beams. The methods described in U.S. Pat. Nos. 5,802,092, 5,793,783, 5,790,310, 5,594,752, 5,579,422, 5,568,577, 5,333,077, and 5,139,609 are similar to the methods mentioned above. However, since lens arrays can only collimate the beam from the diode array to a limited extent, obvious divergence still exists. Because of the beam divergence, laser diode arrays must be close to optical fiber so that the beam spot is small enough to achieve effective coupling. When multiple laser diode arrays are combined, the dimension of beam spot on the fiber aperture plane becomes larger due to the increased distance between laser diode arrays and the fiber aperture. As a result, these methods can not efficiently combine the beams from a plurality of diode laser arrays in to an optical fiber. For example, with these methods, it is impossible to effectively couple the beams from 200 pieces of 20 W diode laser bars into a fiber to make a high-power fiber laser.

SUMMARY OF THE INVENTION

Accordingly, it is the principal object of the present invention to provide methods and devices to shape and combine the beams from laser diode arrays or stacks so that high-efficiency and high-power coupling with target, such as optical fiber, can be achieved. High-efficiency and high-power solid state lasers such as fiber lasers, and high-efficiency transmission of diode laser power through optical fiber can be achieved.

It is another object of the present invention to teach methods of dividing and rearranging diode laser beam into a more circular laser beam.

It is also an object of the present invention to provide a method and apparatus with which a laser beam from a laser diode array with collimating structures can be transmitted for a long distance while the beam spot dimension can be kept substantially unchanged even if the beam from said array is not substantially collimated.

It is another object of the present invention to provide brightness conserved optical pumping systems.

It is another object of the present invention to teach methods of coupling high laser power coupling into optical fiber with high efficiency, such as a method of injecting at least 4000 W power into 0.5×0.2 mm$^2$ cladding and generating fiber laser output of 2500 W.

To achieve the foregoing and other objects, and in accordance with the purposes of the present invention, as embodied and broadly described herein, a preferred apparatus of this invention may comprise a laser fiber with inner cladding, a plurality of brightness substantially-conserved laser diode array modules, and a brightness substantially-conserved optical system for coupling the beam from said laser diode array module into said inner cladding, with each of said laser diode array modules containing a beam shaping structure.

Additional objects, new features and advantages of the present invention will be set forth in part in the following description. Further scope of applicability of the present invention will become apparent from the detail description of the invention provided hereinafter. It should be understood, however, that the detailed description of the invention and the specific examples presented, while indicating preferred embodiment of present invention, are provided for illustration purposes only, because various changes and modifications within the scope and spirit of the present invention will become apparent to those of ordinary skill in the art from the detail description of the invention that follows.

BRIEF DESCRIPTION OF THE DRAWINGS

The accompanying drawings serve to explain the principles of the invention, in which:

FIG. 2(a) shows the situation where CS is 45° from both y- and z-axis and the normal of reflection mirrors (not shown) is in x-z plane and is 45° with both x- and z-axis.

FIG. 2(b) s hows the case where the angle between y-axis and CS is smaller than 45°.

FIG. 2(c) shows the situation where the angle between y-axis and CS is larger than 45°.

FIG. 3 schematically shows an embodiment in which beams BM from an LDA stack LS are divided and rearranged by multiple mirrors M forming a beam spot pattern PP in plane PL lying in the x-y plane.

FIG. 6(a) and FIG. 6(b) illustrate another embodiment in which LDA beams enter the plates obliquely and the incidence angle is different for beams entering each plate. FIG. 6(a) schematically illustrates the relation between the incidence beam and the exit beams from the plates, and FIG. 6(b) is the side view of the embodiment.

FIG. 7(a) and FIG. 7(b) show an embodiment where beam displacement is made by using multiple optical wedges (refraction prisms). FIG. 7 (a) is the view of the embodiment from a position facing the exit beams. FIG. 7(b) is the side view and FIG. 7(c) is the view from the entering beam direction.

FIGS. 8(a) and (b) are two views of the two groups of prisms. FIG. 8(c) indicates the light path within the two groups of prisms and the course of beam-shaping, with only two prisms shown for each group. FIG. 8(d) shows the beam pattern before and after the dividing and rearranging.

FIGS. 9(a)–(c) show the three schematic views of the set-up, with FIG. 9(b) indicating the shape of the divided beam before and after the rearrangement. FIG. 9(d) illustrates the beam direction and relationships in the prisms, where only the optical paths of two prisms for each group of prisms are shown for clarity of description. FIG. 9(e) shows a setup similar with FIG. 9(d) but one group of prisms are replaced with a group of small mirrors.

FIGS. 10(a) and 10(b) are the two schematic views of the device. FIG. 10(c) indicates the shape of the LDA beams before and after the rearrangement.

FIG. 12(a), FIG. 12(b) and FIG. 12(c) show still another embodiment for LDA beam shaping by using a group of prism rods PR. The FIGS. 12(a)–12(c) show the three schematic view of the device. FIG. 12(d) indicates the beam path within a single prism rod PR1.

FIG. 13(a) and FIG. 13(b) show two schematic views of an embodiment based on the principle shown in FIGS. 8(a)–(b) by using a 2-D diode laser array, with FIG. 13(b) being the device shown in FIG. 13(a) viewing from the right hand side. FIGS. 13(c) and (e) shows the beam spot geometry before and after the beam dividing and rearrangement. FIG. 13(d) is the spot shape after the first prism group (PM5). FIGS. 13(f)–(h) illustrate the beam spots after the use of beam shrinking elements.

FIG. 15 shows an illustration of LDAC1 in which a cylindrical lens CL is placed in front of the laser bar so that the beam BM at the fast axis is collimated.

FIG. 22(d) is another view of FIG. 21(c).

DETAILED DESCRIPTION OF THE INVENTION

Figure 1:
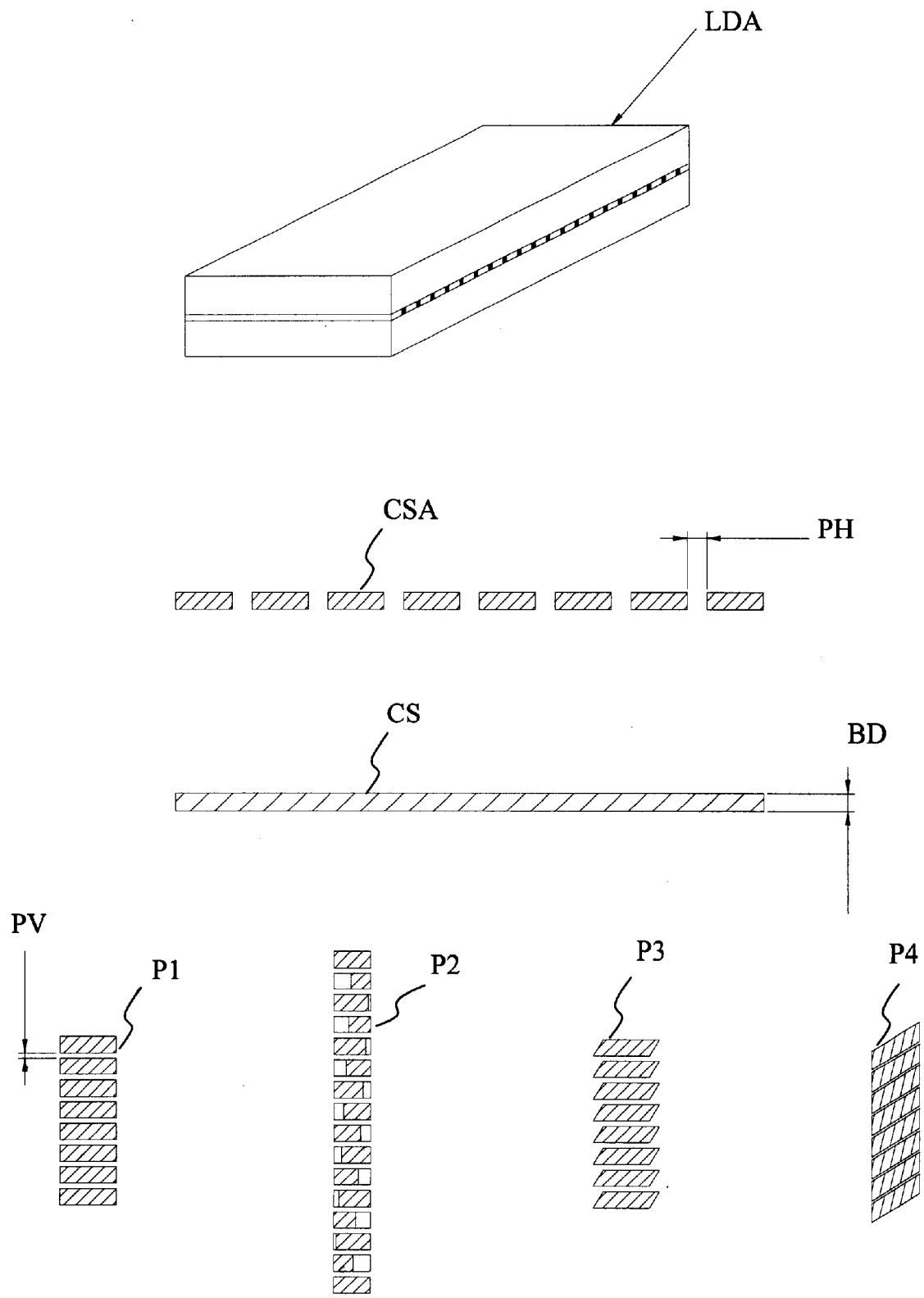
FIG. 1 shows the illustration of some possible results of shaping and rearrangement of LDA beams, in which CSA is the schematic view of emitter beam pattern of a typical laser diode array LDA.

In the present invention, the methods and apparatus for making efficient cladding pumping fiber lasers are disclosed. In particular, new structures for shaping and rearranging laser beams from diode laser array are disclosed. Along with the use of a unique method for coupling pumping laser beam into optical fiber, high efficiency can be achieved. These aspects of the present invention will facilitate the realization of high-efficiency and high-power fiber lasers or other solid state lasers. The beam shaping structures can significantly improve the quality of the beams from diode laser array, and is easy to realize and less demanding in system alignment. Thus, along with the coupling mechanisms disclosed, efficient coupling of diode lasers into optical fiber for high power injection can be made. Essentially, after the diode laser beams passed through the beam shaping structure, the coupling methods make it possible to transmit the beams for a long distance with substantially the same brightness. In other words, with the methods and apparatus disclosed, a laser beam from a laser diode array with collimating structures can be transmitted for a long distance while the beam spot dimension can be kept substantially unchanged even if the beam from said array is not substantially collimated. With the method taught in the present invention, beam shaping and rearranging device can be included in laser diode array modules comprising laser diode arrays (LDA) with collimating structures and relay systems. The presence of said device can improve the quality of beams exit from said collimating structure. Because of the brightness conservation nature of the modules, when a plurality of such modules (such as 3, 9, or more than 200 pieces) are combined, the beams from the arrays can be efficiently coupled into optical fiber. Thus the system can be used for the construction of high-efficiency and high-power fiber or other solid state lasers.

Thus, a method or arrangement is used for beam dividing and shaping, in which the beams from laser diode array are divided in a plurality of sections along the slow axis and the sections of beams are then recombined along their fast axis so that the Lagrange invariant of the resulting beam increased approximately by n-fold in fast axis and reduced approximately by n-fold in slow axis.

Thus, an apparatus for beam dividing and rearrangement of laser diode array can be made, comprising at least one laser diode array emitting laser beams, at least one collimation means collimating said beams, beam dividing/rearranging means including at least one prism group comprising a plurality of prisms, wherein said beams from laser diode array are divided in a plurality of sections along the slow axis and the sections of beams are then rearranged along their fast axis so that the Lagrange invariant of the resulting beam increased approximately by n-fold in fast axis and reduced approximately by n-fold in slow axis.

Thus, in a preferred beam-shaping device, two groups of prisms are used to divide and rearrange the beams from at least one LDA, in which the first group of prisms divide the beams from said LDA and, along with the second group of prisms, rearrange the divided beams along their fast axis, where either the reflection or refraction properties of prisms can be used to in each group of prisms. In a more preferred device, the two groups of prisms are right angle prisms so that the self-alignment of beams can greatly simplify the system construction.

Thus, an apparatus for beam dividing and rearrangement of laser diode array can be made, comprising at least one laser diode array for emitting laser beams, at least one collimation means for collimating said beams, at lease one plate group comprising a plurality of optical plates for dividing and rearranging said beams, in which said plates are stacked with a predetermined offset. The offset can be translation or radial offset. With this arrangement, the beams from laser diode array enters the plates from the stacked side of the plate group, in which the projected emitter line of laser diode array on the incidence surface of the plate group forms a predetermined angle with the interfaces of the plates, whereby said laser beams are divided in a plurality of sections along the slow axis and the sections of beams are rearranged at the same time along their fast axis so that the Lagrange invariant of the resulting beam increased approximately by n-fold in fast axis and reduced approximately by n-fold in slow axis.

Thus, an apparatus for beam dividing and rearrangement of laser diode array can be made, comprising, at least one laser diode array for emitting laser beams, at least one collimation means for collimating said beams, a single plate group comprising a plurality of mirrors that are spaced with a predetermined offset, wherein said beams are intercepted by said mirrors at different location sequentially due to said offset between said mirrors, whereby said laser beams are reflected and divided into a plurality of sections along the slow axis and the sections of beams are rearranged at the same time along their fast axis so that the Lagrange invariant of the resulting beam increased approximately by n-fold in fast axis and reduced approximately by n-fold in slow axis.

With the inclusion of above apparatus, the main objectives of constructing high-efficiency solid state lasers can then be achieved.

Thus, a high-efficiency diode-pumped solid state laser apparatus can be made comprising a laser fiber with its core doped with active species (for cladding pumping fiber laser) or a laser rod doped with active species, at least one laser diode array module, an imaging optical system, wherein said imaging optical system is disposed between said module and the aperture of said fiber and focuses the beam from said module onto the aperture of said laser fiber, and wherein said laser diode array module comprises at least one laser diode array, a collimating structure, a beam dividing/rearranging device and an optical relay system.

Thus, a fiber coupled LDA system of this invention may comprising at least one laser diode array, means for beam collimating, at least one optical fiber, means for beam dividing and rearranging, an optical relay system, and means for beam focusing, wherein the laser beams from said laser diode array, collimated by said means for beam collimating, are divided and rearranged by said means for beam dividing and rearranging and focused on to the aperture of said optical fiber by said means for beam focusing.

1. Beam Shaping and Rearrangement

Although laser diode arrays (LDA) have been often used in pumped solid state lasers, the potential efficiency of these arrays has not been fully realized because of astigmatism and other poor beam qualities. In theory, by beam shaping, beams with much better quality can be obtained. The configuration of emitter structure of LDA and the beam structure and geometry are well known in the art. For example a typical commercially available diode LDA has 19 groups of emitters. Each group has a dimension of 150 microns. The total length of LDA at slow axis being 10 mm, while the dimension at fast axis is only about 1 micron. In general, the so-called beam shaping is to divide and rearrange the beams from laser diode array, and reduce the Lagrange invariant in slow axis. FIG. 1 shows the illustration of some possible results of shaping and rearrangement of LDA beams, in which CSA is the schematic view of emitter beam pattern of a typical laser diode array LDA. Pattern PI illustrates shape of the resulting beam cross-section that is formed when the LDA beams are divided according to the spacing between the emitters and rearranged along the fast axis of the beams. The schematic views P3 and P4 show another two possible beam cross-sections after beam dividing and rearranging by using different methods. Among P1, P3, and P4, beam spot P1 represent a better beam quality than the other two.

The object of beam shaping and rearrangement is met by the features of claim 1 to 20. The beam shaping and rearrangement is mainly achieved by using a plurality of prisms. Thus, a method or arrangement is used for beam dividing and shaping, in which the beams from laser diode array are divided in a plurality of sections along the slow axis and the sections of beams are then recombined along their fast axis. Ideally, the Lagrange invariant of the resulting beam increased approximately by n-fold in fast axis and reduced approximately by n-fold in slow axis. In the present invention, the pattern of LDA emitters is simplified as CS in FIG. 1. That is, the number of emitters in LDA is not considered in beam dividing. The goal of beam shaping in this invention is to divide the beams from the emitter and rearrange them into the patterns such as P1, P3 and P4. Since the spacing between the emitters (PH) is not considered, the number of division of the beams from LDA is not limited by the number of emitters of the laser diode array. Therefore, besides pattern P1, P3, and P4, beam pattern P2 can also be formed and provide substantially the same improvement to the diode laser beam quality as P1. Such division will make the beam shaping devices easy to make and lower in cost.

Some embodiments for LDA beam dividing and rearrangement are disclosed below. In all the examples, beams from LDA are collimated before the beam shaping.

Figure 2A:
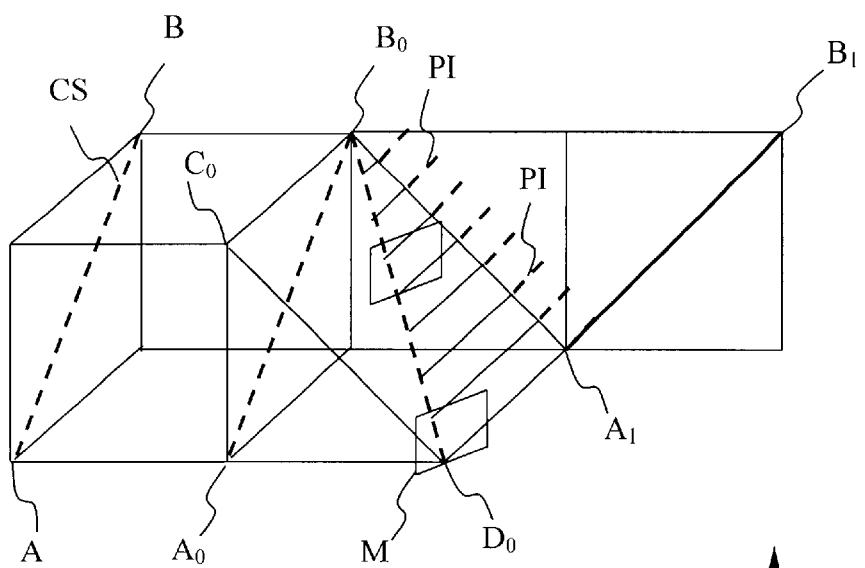
FIG. 2(a), FIG. 2(b) and FIG. 2(c) show an embodiment that illustrates a single reflection method using a plurality of mirrors for beam dividing and rearrangement.
Figure 2B:
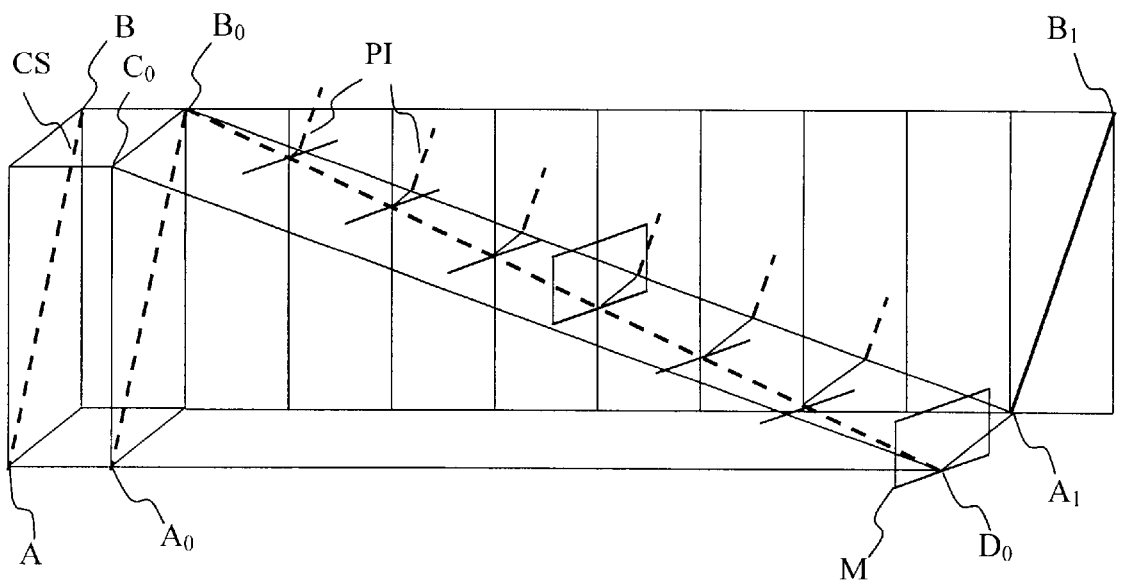
Figure 2C:
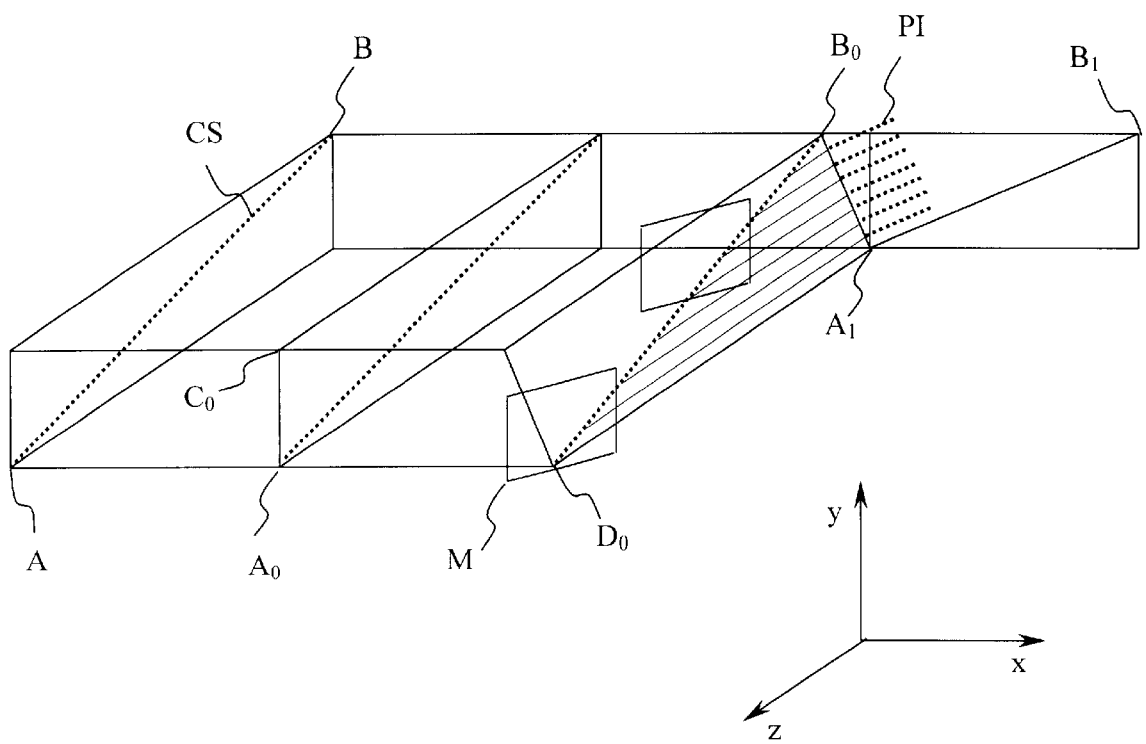

A method is shown in FIGS. 2(a)–(c). This is a single reflection method using a plurality of mirrors for beam dividing and rearrangement. In FIG. 2(a), CS is the schematic view of the LDA emitter that is located in y-z plane. The beams from CS transmit along x- axis within plane $BB_0D_0A$. When a small mirror M is placed at $D_0$, light beam $AD_0$ is reflected by M to be beam $D_0A_1$, along z-axis. The mirror image of CS is at the $A_1B_1$ direction and has the same angle with y-axis as CS. The arrangement is set so that line $A_1B_0$ is perpendicular to $A_1B_1$. If multiple small mirrors are placed along $D_0B_0$ to divide the beam coming from CS, light beams coming from CS through plane $BB_0D_0A$ will be reflected by these mirrors and transmit in plane $A_1B_0D_0$, and multiple images (PI) will be formed along $A_1B_0$. These images have the same direction as $A_1B_1$ that is perpendicular to $A_1B_0$. Therefore the Lagrange invariant at the slow axis can be shrunk to 1/n, where n is the number of mirrors placed along $D_0B_0$. In this arrangement, all the mirrors are parallel to each other, and separated with substantially equal distance from each other along $D_0B_0$. Before the reflection, the distance between point A and B is the width at slow axis of the LDA emitters CS. After the multi-mirror reflection, the beam width at slow axis will be AB/n, and the width of the laser beam at fast axis becomes $A_1B_0$, which depends on the inclination angle of CS as shown in FIG. 2(b) and FIG. 2(c). It is preferred to make the length of $A_1B_0$ equal to n*BD, where BD is the beam width of CS at fast axis (FIG. 1), so that the beam filling factor at $A_1$, $B_0$ equals to 1. If and only if the inclination angle meets this requirement, Lagrange invariant can be the same as predicted.

In FIG. 2(a), CS is 45° from both y- and z-axis, and the normal of reflection mirrors (not shown) is in x-z plane and is 45° with both x- and z-axis. After the reflection by the mirrors, the images, such as $A_1B_1$, is 45° with both x- and y-axis. As long as the centers of intersection of beams from CS and each individual mirror is located along $D_0B_0$, after beam dividing and reflection the beams will be rearranged along $A_1B_0$. Although in FIG. 2(a) small mirror M reflects beam $AD_0$ to $D_0A_1$, at 90°, it is obviously, it can also reflect at other angles.

In FIG. 2(b), the angle between y-axis and CS is smaller than 45°. In this case, after the rearrangement, the length of $A_1B_0$ is longer than AB. Such system is more suitable when the width of CS is large, such as for 2-D LDA or LDA stacks. FIG. 2(c) shows the situation where the angle between y-axis and CS is larger than 45°. After the rearrangement, the length of $A_1B_0$ is shorter than AB. Such arrangement is more suitable when the width of CS is narrow.

Based on the geometric relationship discussed above, all the dimensions can be calculated accurately. To divide and rearrange the beams from LDA emitters, the translation direction of rearrangement must be perpendicular with the emitter direction, that is, $A_1B_1$ is perpendicular to $A_1B_0$. In this case, the object can be achieved that the Lagrange invariant will be reduced in one direction and increased in the other direction. The distance between the divided and rearranged beam section equals the sum of beam dimension at fast axis BD and the spacing PV in FIG. 1, in which it is preferred to keep PV minimal. When this distance is determined, the spatial position of reflection mirror is exclusive.

The beam dividing and rearrangement by the single reflection from multi-mirrors will provide a rearranged beam spot similar to P3 or P4 because of the oblique arrangement between the emitter CS and the mirrors as shown in FIGS. 2a)–(c). This is more pronounced in another embodiment shown in FIG. 3. In this embodiment, beams BM from an LDA stack LS are divided and rearranged by multiple mirrors M forming a beam spot pattern PP in plane PL lying in the x-y plane. This embodiment and the embodiment in FIGS. 2(a)–(c) both shows that the number of mirrors is not limited by the number of emitters of the LDA.

Figure 4:
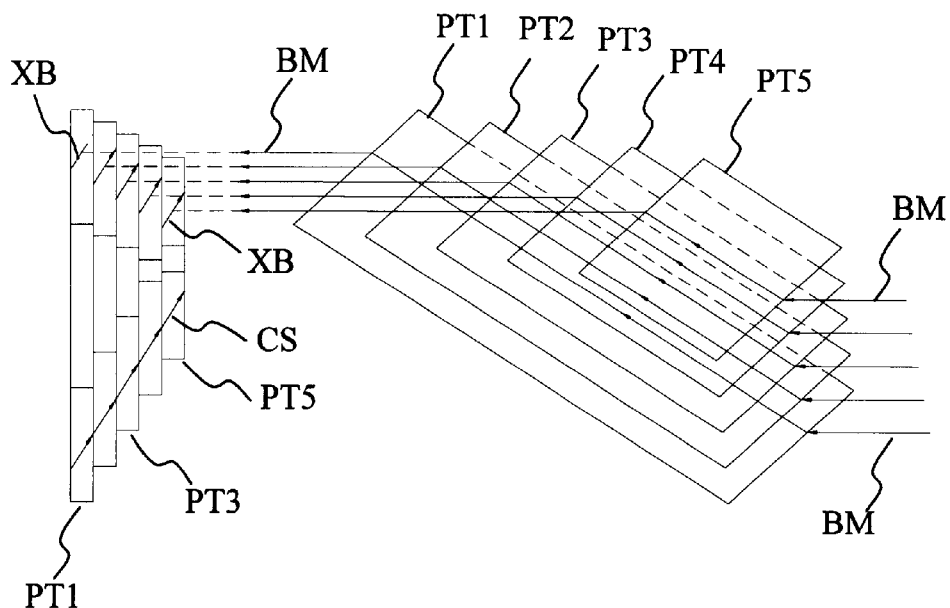
FIG. 4 shows two schematic views of another embodiment of achieving the object of beam dividing and rearrangement in which one set of optical plates is used to divide and rearrange the laser beams from LDA.
Figure 5:
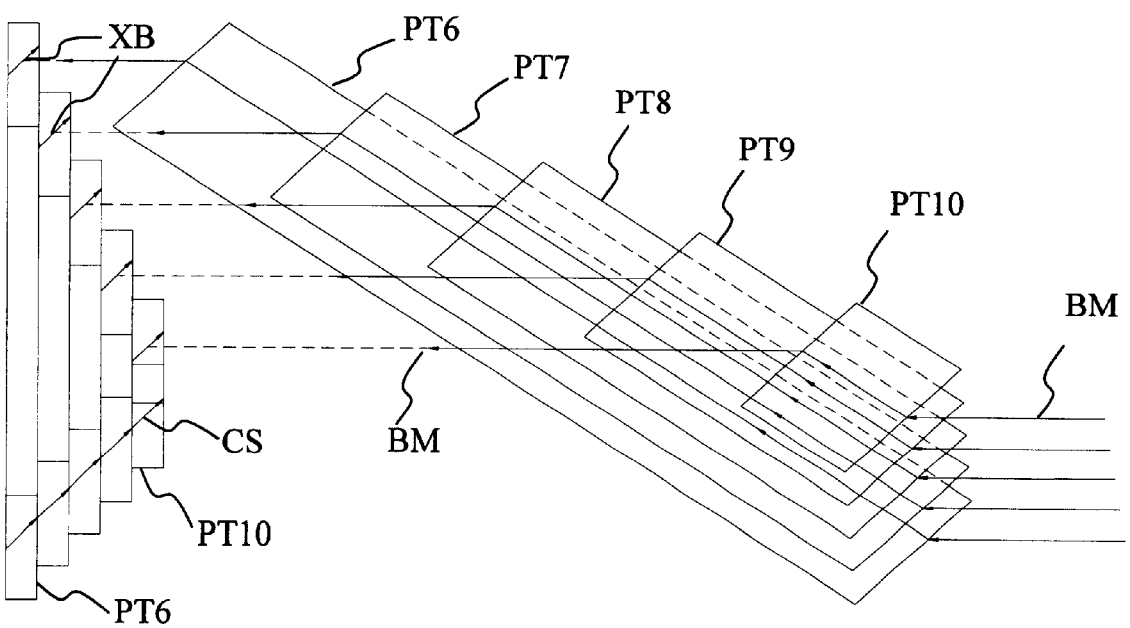
FIG. 5 is another embodiment with the same principle as the embodiment in FIG. 4, in which the separation space between the rearranged exit beams is made very large.

Similar to single row of mirrors mentioned above, the refraction of single group of wedges or parallel plates can also be used to achieve beam dividing and rearranging. FIG. 4 shows another embodiment of achieving the object of beam dividing and rearrangement. In this method, one set of optical plates is used to divide and rearrange the laser beams from LDA. By means of this method, Lagrange invariant of the LDA is shrunk to approximately 1/n at the slow axis, and is increased to approximately n fold at fast axis, where n is the number of the plate. FIG. 4 shows two views of the multi-plate system. Plates PT1 to PT5 (n=5) have the same thickness but different sizes. Laser beams from the LDA emitter CS enters the plates from one side with the same incidence angle. The beams BM divided by these plates have a different travel length in each plate. The beams divided by these plates thus have a different displacement when exiting from the other side of the plates. Therefore, beams from LDA emitters CS becomes multiple exit beams XB, which have substantially the same length, and are parallel to CS as expected. By varying the inclination angle between the emitter line CS and the plates, the separation space between these rearranged emitters can be adjusted to change the laser beam width to a desired value. FIG. 5 is another embodiment with the same principle as the embodiment in FIG. 4. PT6–PT10 are the plates for beam dividing and rearranging. In this example, the separation space between the rearranged exit beams XB is made very large. This is suitable to be used for 2-D LDA or LDA stacks, which usually have a large bean width.

Using multiple optical plates with the same length of optical path and different incidence angle, the results in FIGS. 4 and 5 can also be obtained. This is shown in the embodiment in FIGS. 6(a)–(b). Light from emitter line CS enters the plates obliquely. All the plates have the same dimension. Since the plates are placed with an angle to each other, the incidence angle is different for beams entering each plate. FIG. 6(a) schematically illustrates the relation between the incidence beam and the exit beams from the plates. FIG. 6(b) is the side view of the embodiment. The distance between the exit beams XB can be adjusted by varying the angle in which the plates are stacked.

Moreover, beam displacement generated above can also be made by using multiple optical wedges (refraction prisms) as shown in FIGS. 7(a)–(c). In this embodiment, laser beams from LDA emitter AB enters different prisms ($PS_1$, $PS_2$, $PS_3$, $PS_4$, and $PS_5$) from different distances [FIG. 7(b)]. By beam dividing and displacement of position, exit beams XB is formed as shown in FIG. 7(a), which is the view of the embodiment from a position facing the exit beams. FIG. 7(c) is the view from the entering beam direction.

Besides the arrangement using single reflection group or single refraction group, the beam dividing and rearrangement can also be achieved with two groups of optical elements. Thus, in one preferred beam-shaping device, two groups of prisms are used to divide and rearrange the beams from at least one LDA, in which the first group of prisms divide the beams from said LDA and, along with the second group of prisms, rearrange the divided beams along their fast axis, where either the reflection or refraction properties of prisms can be used to in each group of prisms. In a more preferred device, the two groups of prisms are right angle prisms so that the self-alignment of beams can greatly simplify the system construction. An even more preferred device includes a collimating structure between said LDA and the beam dividing and rearranging prisms.

Figure 8A:
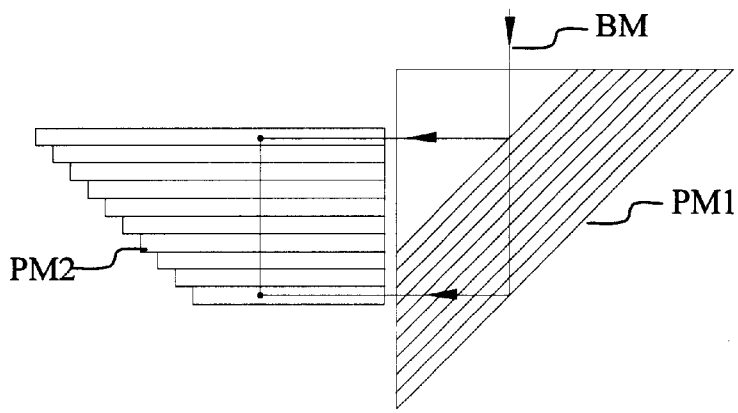
FIG. 8(a), FIG. 8(b) FIG. 8(c) and FIG. 8(d) show that, by means of multiple prisms, the laser beams from LDA emitters are divided and rearranged by two prism groups.
Figure 8B:
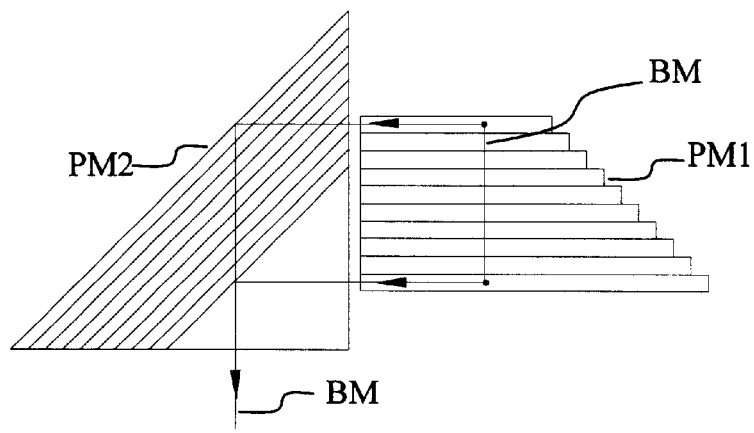
Figure 8C:
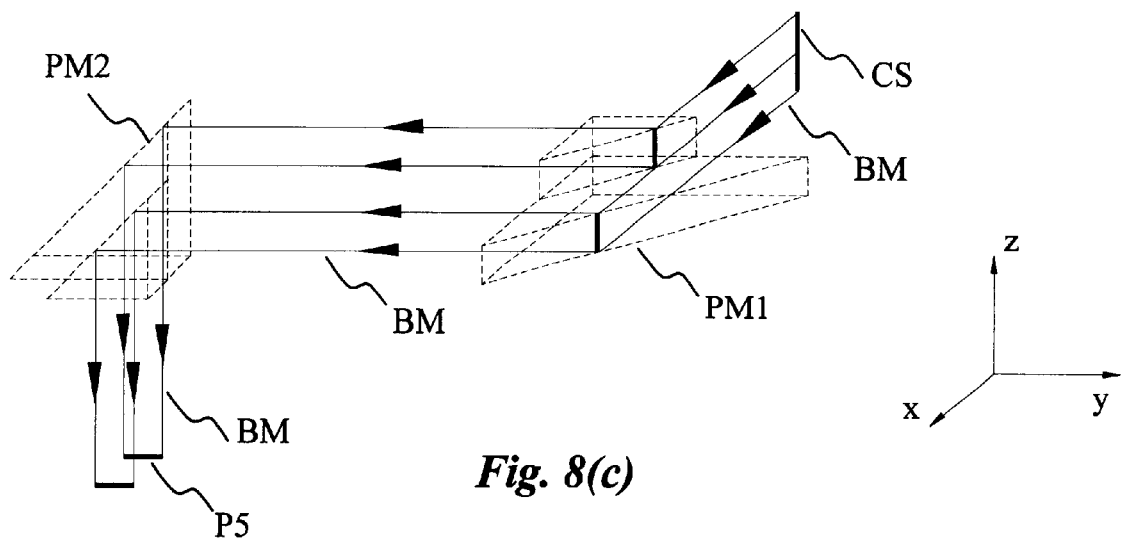
Figure 8D:
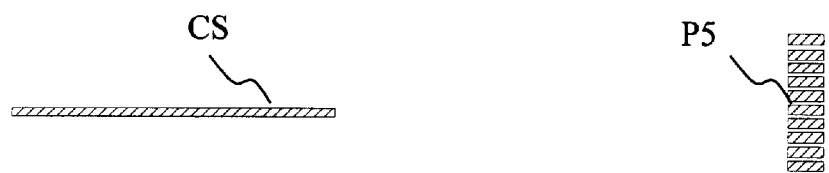

By means of multiple prisms, the laser beams from LDA emitters are divided by n prisms into n sections and then transmit in n different optical paths. The n sections of beams are then rearranged and piled up by another n prisms. FIGS. 8(a) and (b) are two views of the two groups of prisms. Beams from LDA emitters enter prism group PM1, which divided the beams into multiple sections. The beams are then reflected from the hypotenuses of the prisms in PM1 with each beam reflected from one prism being offset from the other sequentially due to the hypotenuse offset of the prisms in PM1. The beams from PM1 then enter the second prism group PM2, and rearranged after reflection from the hypotenuses due to the predetermined offset of prisms in PM2. The beam pattern CS of LDA, after the dividing and rearranging, will become beam spot with pattern P5 as shown in FIG. 8(d). FIG. 8(c) indicates the light path within the two groups of prisms and the course of beam-shaping. Only two prisms are shown for each group for easy understanding. In this example, all the prisms are 45°–90° prisms. It is obvious that other prisms can be used to achieve substantially the same results. In FIGS. 8(a)–(b), n=10, but it is obvious that n could be any other number. For n=10, the Lagrange invariant in elongated direction is changed to be approximately 1/10 of the original value, and in the fast axis, the value becomes approximately ten times larger. In FIGS. 8(a)–(b), the hypotenuse length of the right angle is an arithmetic series, but using n prisms with the same hypotenuse length is also possible. As long as the positions of hypotenuses are the same and the optical path is not changed, the result is the same.

Figure 9A:
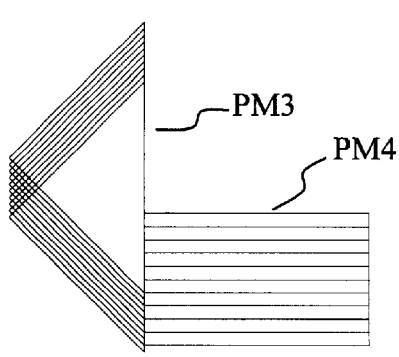
FIG. 9(a), FIG. 9(b), FIG. 9(c), FIG. 9(d) and FIG. 9(e) show another embodiment for LDA beam dividing and rearranging using two groups of prisms.
Figure 9B:
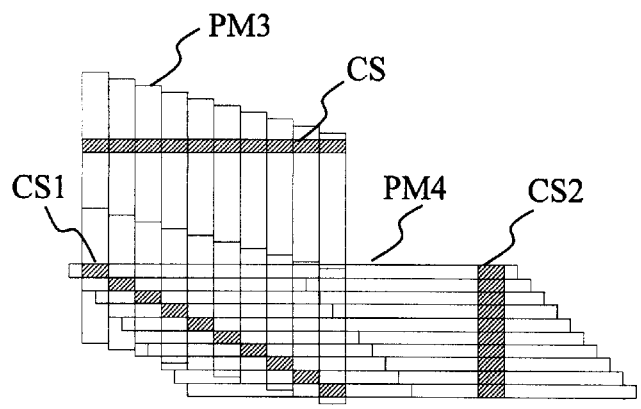
Figure 9C:
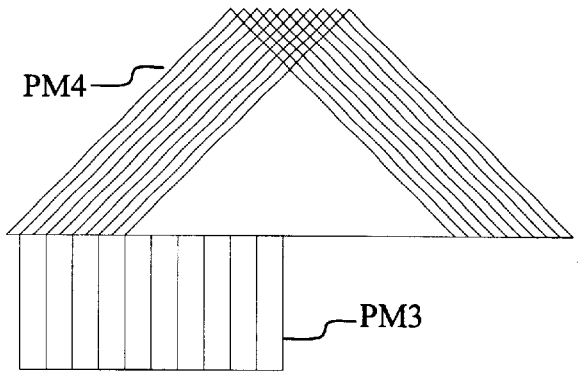

FIGS. 9(a)–(c) show another embodiment for LDA beam dividing and rearranging. This device uses two groups of prisms, PM3 and PM4. In each group, there are ten pieces of prisms, but the number of prisms (n) in each group is arbitrary. FIGS. 9(a)–(c) show the three schematic views of the set-up. The prisms in each group are placed so that the prisms in both of the groups are offset with the same distance form each other. In FIG. 9(b), the shadowed areas indicate the shapes of the divided beam before and after the rearrangement. In FIG. 9(b), CS is the shape of entrance beam, CS1 is the shape of the beams exiting PM3 and entering PM4, and CS2 is the shape of the rearranged beams exiting PM4.

Figure 9D:
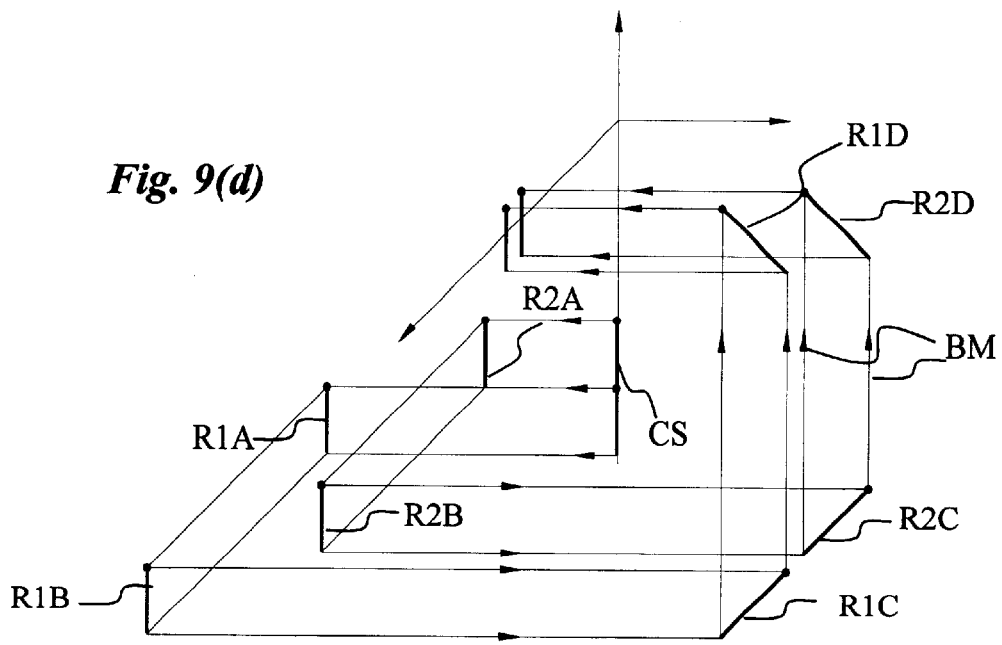

In a preferred arrangement, the prisms are right angle prisms. Laser beams from LDA enter the prisms of PM3 and divided into a plurality of sections (10 sections in FIGS. 9(a)–(c)) along the slow axis by prisms of PM3. After total reflections in the prisms the divided beams exit the prisms parallel but opposite to the direction of the entrance beams [FIG. 9(d)], and each beam has an offset as shown by CS1 in FIG. 9(b) due to the offset of the prisms. The exit beams from PM3 then enters the second group of prisms PM4. Since the prisms in PM4 are also placed with a certain offset as shown, the beams after the total reflection will be rearranged along the fast axis (CS2) as shown in FIG. 9(b). FIG. 9(d) illustrates the beam direction and relationships in the prisms, where only the optical paths of two prisms for each group of prisms are shown for clarity of description. In FIG. 9(d), the emitter line CS is placed in z-axis. Beam travels along x-axis until reflected at R1A and R2A. The offset between R1A and R2A are caused by the offset of prisms in PM3. The divided beams from R1A and R2A then travel along y-axis, and enter PM4 after reflected at RIB and R2B within PM3. In PM4, the beams are reflected two more times at R1C, R1D, and R2C, R2D. PM4 is placed orthogonal to PM3, and the resulting beams are arranged in the direction of y-axis. It can be seen that by varying the offset of prisms in each prism group, a desired beam pattern can be formed after the beam dividing and rearranging. The beam pattern CS of LDA, after the dividing and rearranging, will become beam spot with pattern CS2 which is the same as P5 shown in FIG. 8(d). By selecting appropriate thickness for prisms in two prism groups, the gap PV between beams (see FIG. 1) in the resulting beam spot can be minimized.

Figure 9E:
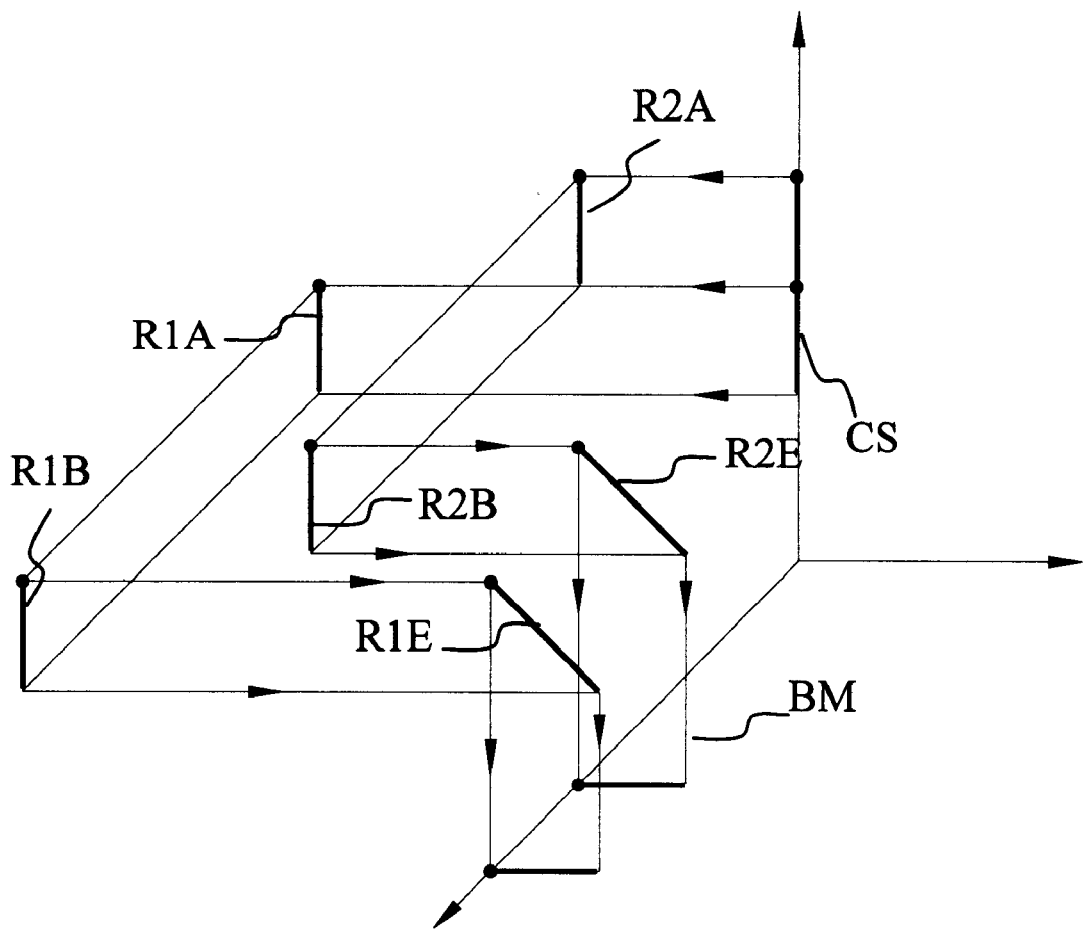

The exit beams from PM4 have a much better optical quality, and can be coupled into optical fiber with high efficiency. The beam path in the double-reflection prisms are self-aligned. This will be especially beneficial to the optical fabrication and assembly because slight out-of-alignment will not affect the performance of the beam dividing/rearranging system. FIG. 9(e) shows a setup similar with FIG. 9(d) but PM4 is replaced with a group of small mirrors. The device can achieve the same results as that shown in FIG. 9(d). However the requirement in mirror alignment is stricter.

Figure 10A:
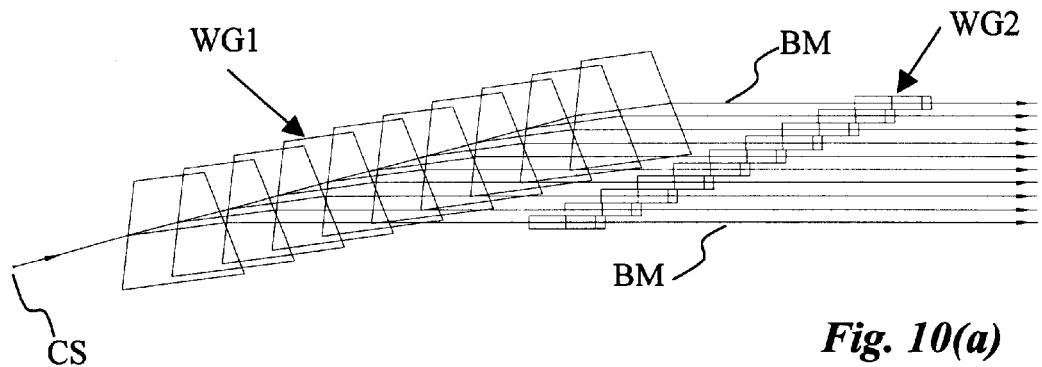
FIG. 10(a), FIG. 10(b) and FIG. 10(c) shows yet another embodiment for shaping LDA beams by using wedges (refraction prism) for beam dividing and rearrangement.
Figure 10B:
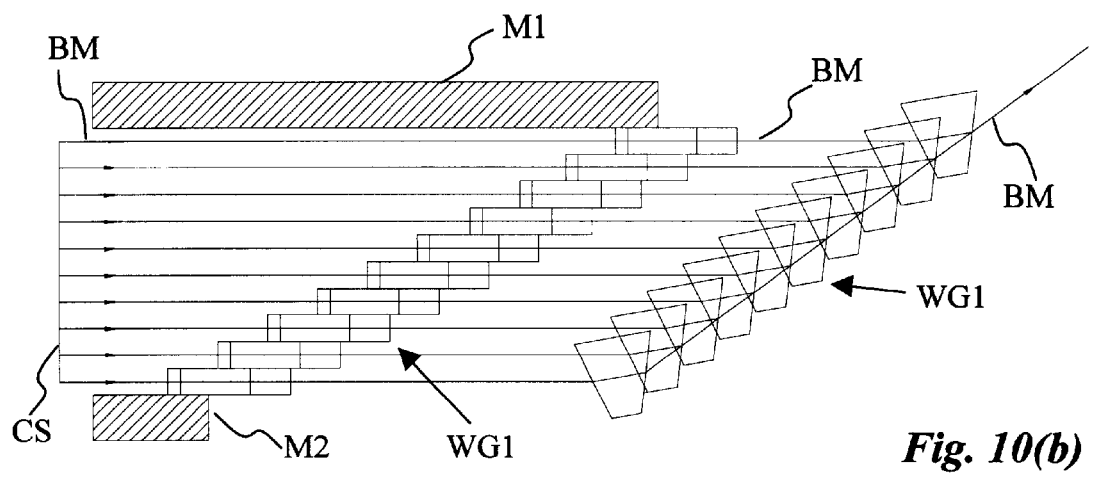
Figure 10C:
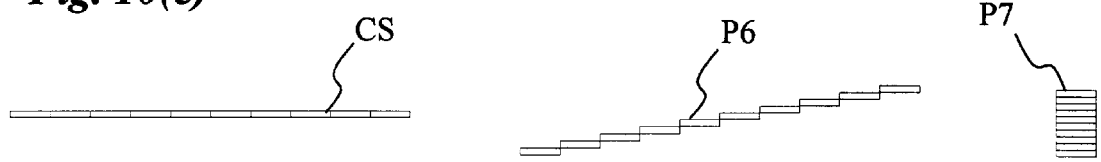

FIGS. 10(a)–(b) show yet another embodiment for shaping LDA beams. This device uses wedges (refraction prism) for beam dividing and rearrangement. FIGS. 10(a) and 10(b) are the two schematic views of the beam shaping arrangement. In this system, the first group wedges WG1 include n pieces of wedges that are staggered with a certain displacement. LDA beams BM enter the wedges of WG1 from one side. The wedges divide the laser beams from LDA emitter line CS into n sections (in FIGS. 10(a)–(b), n=10). The beams from WG1 are offset along fast axis. The beams from WG1 are further rearranged and piled up by a second wedge group WG2 in which the wedges are staggered with a certain displacement. FIG. 10(c) indicates the shape of the LDA beams before and after the rearrangement. In FIG. 10(c), the emitter line CS is divided into ten sections corresponding to the number of wedges in WG1. P6 is the pattern of beams that exit from WG1. After WG2, the beam is rearranged into P7, which is essentially the same as P5 (FIG. 8(d)).

Laser beam from LDA could be well collimated by a cylindrical lens at the fast axis, but the divergence at the slow axis can still be significant. Optional mirrors M1 and M2 can be used to guide the beam at the slow axis if the travel distance is too long as shown in FIG. 10(b). The two parallel side of a wedge can also be polished to guide the laser beam. This is advantageous if the optical path in each wedge is long.

The advantage of using wedges to divide a laser beam is the relatively loose tolerance in manufacturing. Both the wedge position and rotation have little influence in beam position and direction. This is particularly true when the wedges are used at the minimum deviation position (i.e. the symmetrical position) as shown in FIGS. 10(a)–(b).

In the embodiment shown in FIGS. 10(a)–(b), all the wedges (or refraction prisms) in each group have the same dimension. It is obvious that wedges having different dimension can also be used. For example, the wedges in the first group for beam-dividing can each have a different size so that the object of the relay system (see below) can be controlled at the same distance.

Figure 11A:
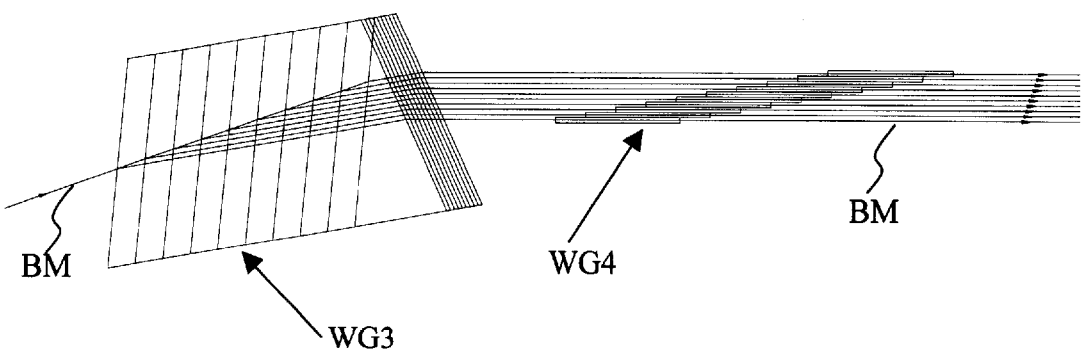
FIGS. 11(a) and (b) show the two views of another embodiment using prisms with different dimensions in the first prism group WG3.

In another embodiment as shown in FIGS. 11(a) and (b), prisms with different dimensions are used in the first prism group WG3. With the combination of prism group WG3 and WG4, the beam dividing and rearrangement is as effective as the embodiment shown in FIGS. 10(a)–(b). For those in the art, it is obvious that the combination of reflection and refraction of prisms can also be made according to the above embodiments to produce an arrangement for LDA beam dividing and rearrangement.

FIGS. 12(a)–(c) shows still another embodiment for LDA beam shaping. The beam shaping elements are a group of prism rods PR. Each prism rod plays the role of two prisms for beam dividing and rearrangement. In this embodiment, beams from LDA emitters EM after passing a collimating lens RCL is divided by ten prism rods. After two reflections within the prism rods, the beams are rearranged and piled up along fast axis. The FIGS. 12(a)–12(c) show the three schematic view of the device. FIG. 12(d) indicates the beam path within a single prism rod PR1.

FIGS. 13(a)–(b) shows two schematic views of an embodiment based on the principle shown in FIGS. 8(a)–(b). Unlike the embodiments disclosed above, LDA in this embodiment is a 2-D diode laser array TD. By using collimating means TC in front of the emitters, the beams at the fast axis are collimated. In this arrangement, three pairs of prisms are used in each group to divide the laser beam at the slow axis and rearrange it in the same way shown in FIGS. 8(a)–(b). By comparing FIGS. 13(a) and (b), it can be seen that the prisms in PM5 are not all the same as those in FIGS. 8(a)–(b). Therefore, as long as the beam paths are not affected, the shapes of the prisms are not critical. FIGS. 13(c)–(e) shows the beam spot geometry before and after the beam dividing and rearrangement. FIG. 13(d) is the spot shape after the first prism group (PM5), and FIG. 13(e) is that after the second group (PM6) of prisms. It can be seen that the beam dimension at fast axis is very long after the rearrangement because of the spot dimension of the 2-D array shown in FIG. 13(c). 2-D arrays have large dimension at both fast and slow axis, such as a dimension of 10—50 mm$^2$. Thus when 10 prisms are used for each prism group, the dimension after rearrangement will be 1×500 mm$^2$, and it becomes inconvenient for relaying and focusing. Therefore, it is preferred to shrink the beam dimension at fast axis before beam dividing. Essentially, optical elements can be used to shrink the beam spot from that shown in FIG.

13(c) to FIG. 13(f) which will become FIG. 13(g) after the first group of prisms, and become FIG. 13(h) after the second group of prisms.

Figure 14A:
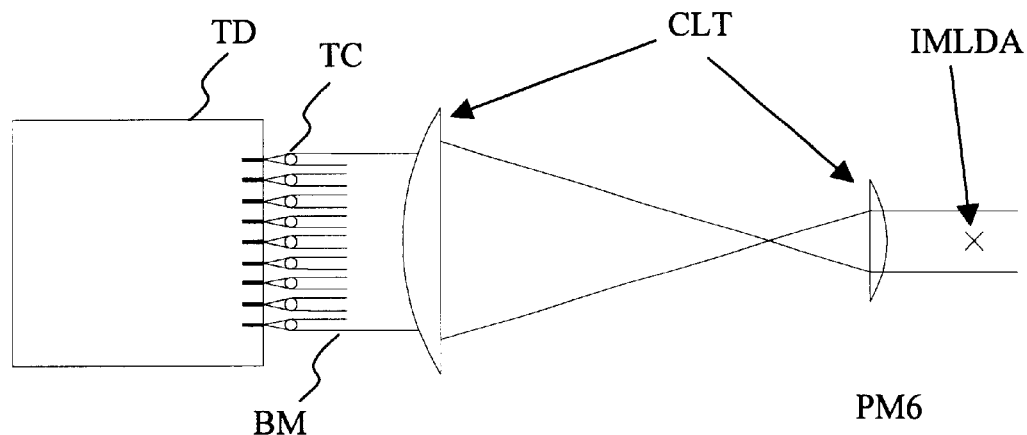
FIGS. 14(a) and (b) shows, respectively, two views of an embodiment of beam dividing and rearrangement for a 2-D array in which optical elements for beam shrinking are included (the prism groups are not shown).
Figure 14B:
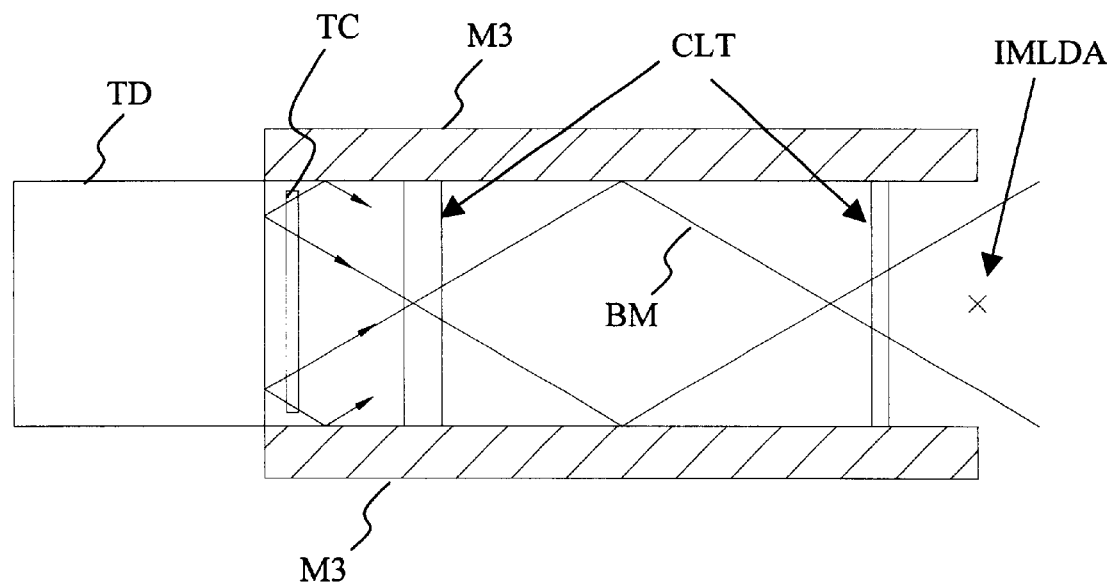

FIGS. 14(a) and (b) shows, respectively, two views of an embodiment of beam dividing and rearrangement for a 2-D array in which optical elements for beam shrinking are included. This arrangement is based on the discussion above showing the beam shrinkage before the beam dividing and rearrangement, but the prism groups are not shown. By using a cylindrical telescope CLT and two parallel mirrors (M3) (not shown in FIG. 14(a)), the beam dimension at fast axis will be shrunk to 1/m at IMLDA, where m is the magnification of CLT, and IMLDA is the image of the 2-D LDA formed by CLT. Due to the reflection of mirrors, beam dimension and divergence at slow axis is kept the same at IMLDA. Therefore, smaller prism group can be used to divide and rearrange the laser beams at slow axis after IMLDA, and smaller relay optical system can be used for focusing.

Since all the embodiments disclosed above for beam dividing and rearranging can be used to shrink the focal spot of a 2-D array at the slow axis, every embodiment for beam dividing and rearranging mentioned above can be placed at IMLDA and achieve object of beam shaping for 2D-arrays. For example, principle used in FIGS. 9(a)–(c) can be easily applied to shape beams from a 2-D laser diode array.

In the above-disclosed systems, the same type of prisms are used for most of the cases. For example, the two groups of prisms are either both refractive or both reflective. It is obvious that different components can be used for beam dividing and rearranging. For example, a beam can be divided by reflection prisms and then rearranged by refraction prisms, and vice versa.

2. Lagrange Invariant of Laser Diode Arrays

To use LDA in diode-pumped solid state laser, the beam should be collimated. An LDAC is a device comprising LDA and collimating structures. To further achieve the objective of providing methods for diode-pumped solid state lasers, the above-disclosed beam shaping devices can be included into LDAC's. LDAC can have very different Lagrange invariant and therefore have very different brightness depending on the collimating structures used. For a given LDA, it is preferred that the Lagrange invariant of LDAC is as small as possible so that more power can be injected into a small area. Some LDAC's with and without the beam shaping device are described below. As examples, a 20 W laser diode array is used in all these examples.

(a) LDAC1 has a laser bar with multiple emitters EM. The light emitting aperture is 1 cm×1 $\mu$m and the divergence angle is 10°×40°. The Lagrange invariant of LDAC1 is 1.7×0.00073 (mm.rad)$^2$. FIG. 15 shows an illustration of LDAC1 in which a cylindrical lens CL is placed in front of the laser bar so that the beam BM at the fast axis is collimated. If the focal length of CL is 1 mm, the aperture of CL is 0.73 mm. If the cylindrical lens forms the image of the emitter aperture of 1 $\mu$m at a distance of 730 mm, the image height is also 0.73 mm. The laser beam leaves CL with an aperture of 1 cm×0.73 mm and a divergence angle of 10°×0.001 rad, and has an unchanged Lagrange invariant.

Figure 16:
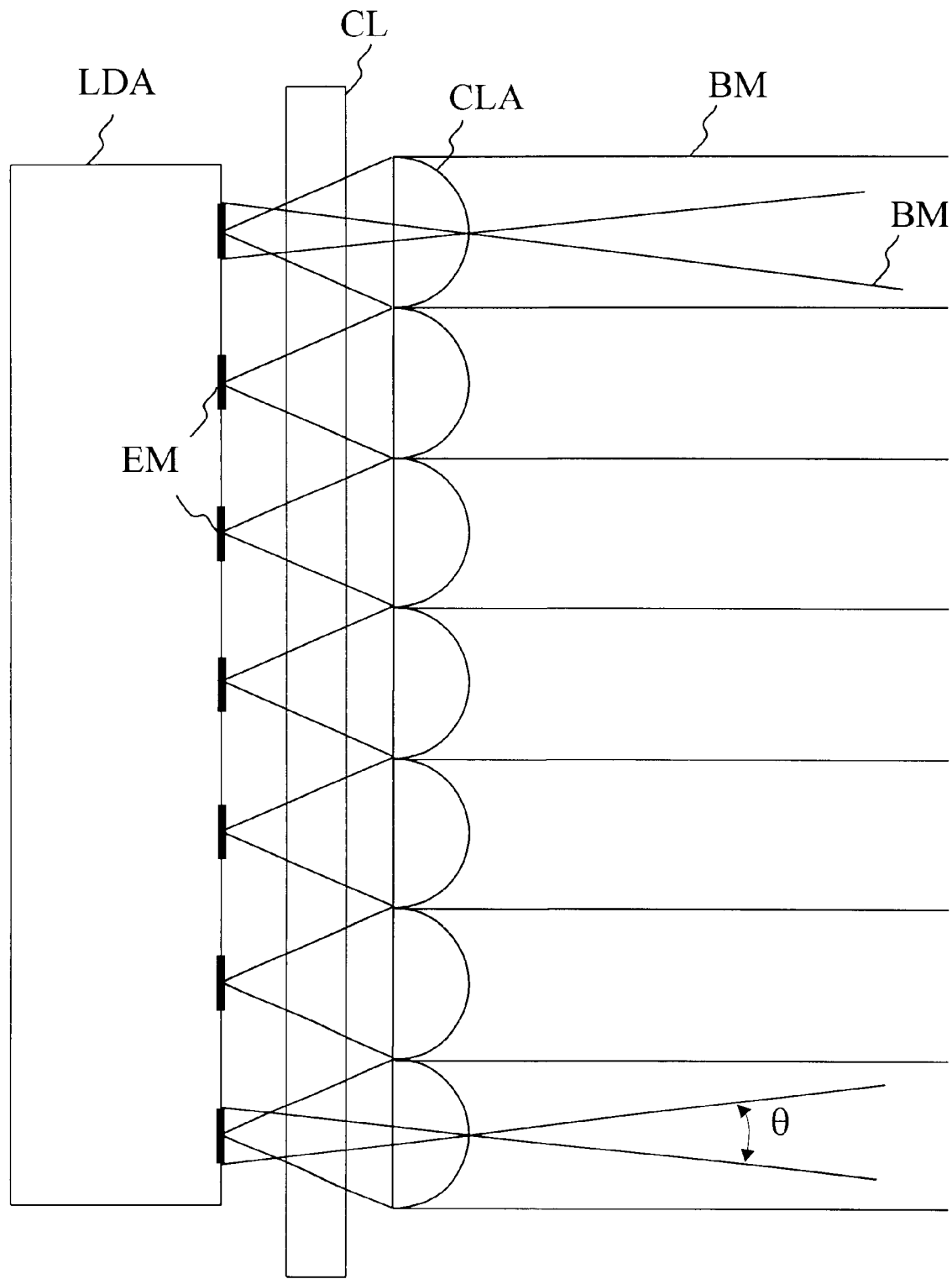
FIG. 16 is a schematic illustration of LDAC2, wherein, besides a cylindrical lens CL like in FIG. 15, a cylindrical lens array (CLA) is disposed.

(b) LDAC2 has the same light emitting aperture and divergence angle as in LDAC1, but each emitter EM in this case is divided into 20 separate segments spaced apart. The width of each segment is 150 $\mu$m×1 $\mu$m. Beam filling and collimating optics are used so that the brightness of the individual segment is conserved. As shown FIG. 16, besides a cylindrical lens CL like in FIG. 15, a cylindrical lens array (CLA) is disposed in front of the emitter segments. The Lagrange invariant of the LDA is 0.46×0.00073 (mm.rad)$^2$. Thus, comparing with LDAC1, Lagrange invariant is improved four times by using CLA. A fill factor of 1 can be achieved, filling the aperture and minimizing divergence angle θ. After CL and CLA, the beam from LDAC2 has an aperture of 10×0.73 mm$^2$ and a divergence angle of 0.05× 0.001 rad$^2$, and the Lagrange invariant is unchanged.

(c) LDAC3 is LDAC1 but further including multiple prisms for beam dividing and rearranging. When the arrangement shown in FIGS. 8(a)–(b) is incorporated. The laser beams from LDA is collimated first before entering the beam-shaping device is placed. For n=10, the Lagrange invariant in elongated direction is changed to be $\frac{1}{10}$ of the original value, and in the fast axis, the value becomes ten times larger. Thus the resulting Lagrange invariant is 0.17×0.0073 (mm·rad)$^2$.

When the device in FIGS. 9(a)–(c) is used (as an example, n=10), the resulting Lagrange invariant is also 0.17×0.0073 (mm·rad)$^2$, or (1.7/n)×(0.00073n) (mm·rad)$^2$. It has been noted earlier that such prism is not sensitive to prism rotation. Moreover, other type of prisms, which are not 45°–90° geometrically, can also be used.

Figure 11B:
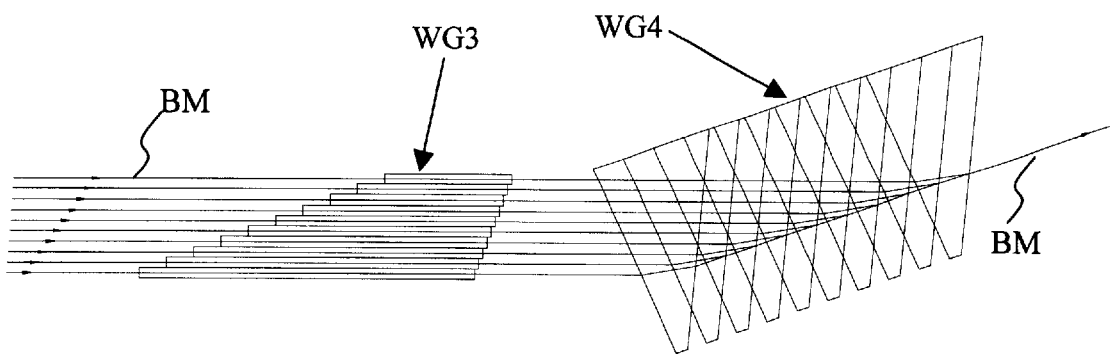

(d) LDAC4 is LDA1 but further including wedges (refraction prism) to divide and rearrange laser beam. For such system, wedge arrangement as shown in FIGS. 11(a)–(b) can be used. With the use of n pieces of wedges in each group, the resulting Lagrange invariant of LDA1 together with a total of 2n wedges is (1.7/n)×(0.00073n) (mm·rad)$^2$.

(e) LDAC5 is LDAC2 with the addition of two groups of beam dividing and rearranging prisms (reflection or refraction prisms). When the number of prisms each group is n, the Lagrange invariant is (0.46/n)×(0.00073 n), or 0.046×0.0073 (mm·rad)$^2$ (n=10), or 0.23×0.0015 (mm·rad)$^2$ (n=2).

If the beams from these different devices are focused by an optics with NA 0.45, the spot dimensions are as the following: LDAC1: 1.9×0.0008 mm$^2$, LDAC2: 0.5×0.0008 mm$^2$, LDAC3 and LDAC4: 0.19×0.008 mm$^2$ (n=10), and LDAC5: 0.05×0.008 mm$^2$ (n=10). Because the spot dimension in one direction is very small, if we combine 200 pieces of the same LDAC's in this direction, the dimension in that direction will be multiplied by 200. The spot dimensions for these combined arrays will become 1.9×0.16, 0.5×0.16, (LDAC3 and LDAC4) 0.63×0.46 (n=3) or 0.25×0.33 (n=2), and (LDAC5) 0.25×0.33 (n=2) mm$^2$, respectively.

For a cladding pumping fiber laser, if the cladding dimension is larger than the spot dimension shown above, the pumping diode laser power will be able to be injected into the laser fiber efficiently. For the example with 200 pieces of LDAC's, this means 4000 W of diode laser power can be injected into a common laser fiber. The LDAC's with beam dividing and rearranging means disclosed above in the present invention apparently has advantages over others due to the small spot dimension.

3. Laser Diode Array Module

By analyzing the problems encountered in making high-efficiency, high-power fiber laser, a conclusion can be made that laser diode arrays with collimating structures such as LDAC's discussed earlier can not provide a substantially collimated beam. The spot dimension of the beam always increases with the increase of distance between an LDAC and the aperture plane of an optical fiber, while the increase of this distance is unavoidable when a plurality of LDAC's are combined. Therefore, although the fiber cladding can be highly efficient in allowing the pumping power to enter the fiber core of a fiber laser, the limit in coupling pumping laser beam into the fiber cladding still limits the total efficiency of a fiber laser. As a result, thus far there has not been a method to achieve a fiber laser with a high output power over, for example, 1000 W.

We discovered that the high efficiency of coupling laser into optical fiber can be achieved by using a laser diode array module further comprising beam dividing and rearranging means disclosed above. A laser diode array module is a system comprising at least one laser diode array with collimating structures (LDAC's) and at least one optical relay system. An optical relay system is an optical system well defined in the art, with which the collimated or even a partially collimated beam from LDAC can be relayed to a more distant point. With the laser diode array module, the beam from a LDAC can transmit for a long distance, while the beam spot dimension including divergence angle after the transmission can be kept substantially the same as they leave the LDAC. Therefore, with said module, brightness conservation can be substantially achieved. It is obvious that both the LDAC's discussed above and other laser diode arrays with collimated structures can be used in said module. The optical relay system comprises at least one optical component such as a lens. It is preferred that the optical relay system includes a cylindrical lens. It is more preferred that the optical relay system include a 4f cylindrical system. It is also more preferred that the optical relay system is substantially telecentric both at the objective space and the image space. It is apparent to the skilled in the art that the relay can be placed in any place in the optical path within the module, and it can also be "mixed-in" with the collimating structures of LDAC's. The advantage of using laser diode array module will be obvious from the examples below.

Figure 17:
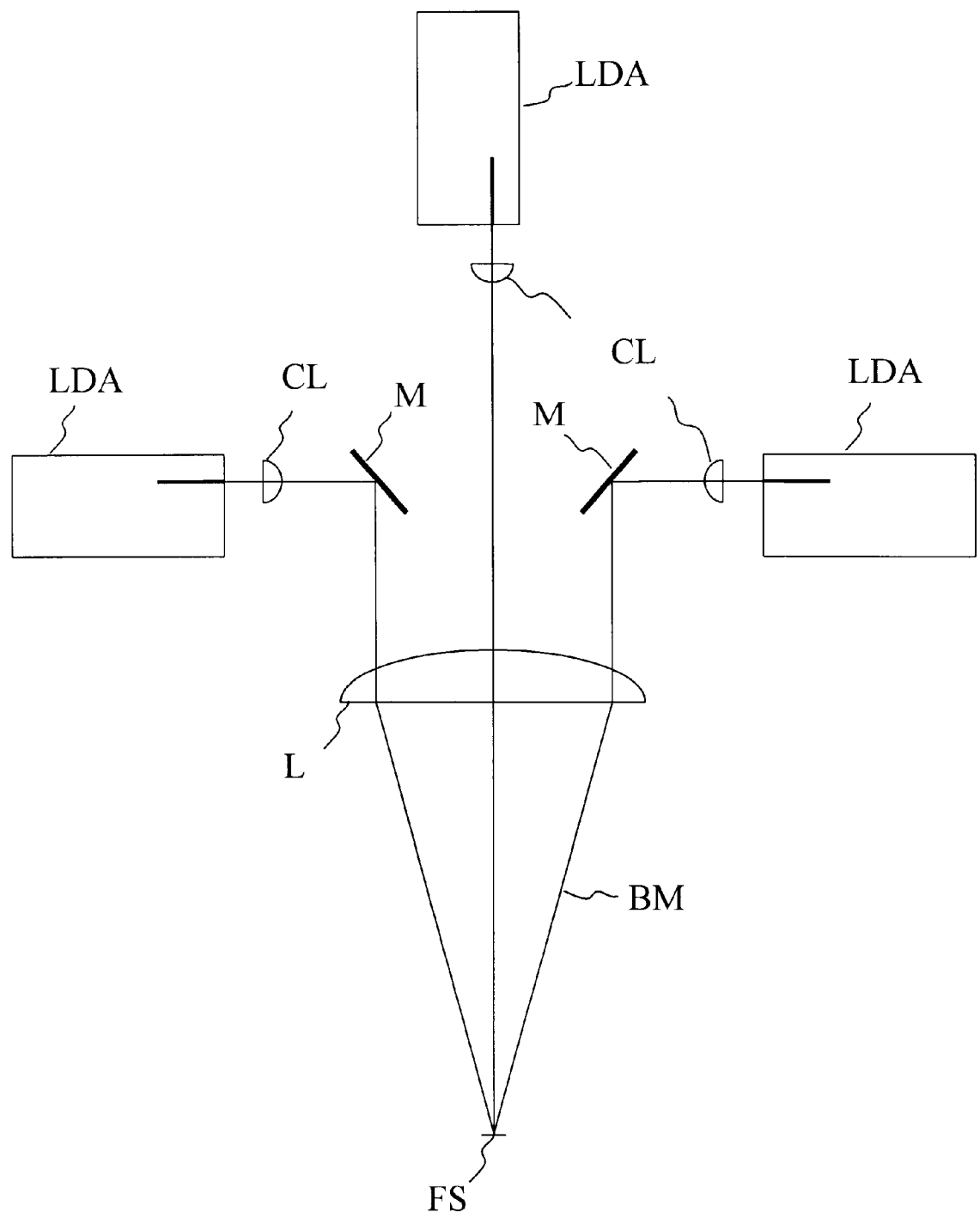
FIG. 17 is a schematic illustration for a combination of three LDAC's.

Referring to FIG. 17, there is shown in schematic illustration a combination of three LDAC's. In this example, each LDAC has a cylindrical lens CL for collimating beam BM from LDA. The beam from the LDAC is collimated at the fast axis with the beam being divergent at the slow axis. The three beams are made parallel with small mirrors M, and then focused by lens L to the common focal spot FS. If the aperture of a laser fiber coincides with FS, and the inner cladding dimension (including NA) is larger than the beam spot dimension, all of the laser beams can be injected (or coupled) into the laser fiber. Because the laser beams are divergent at the slow axis, the distance from LDAC's to L is made as short as possible so that the diameter of L can be small. If the NA of lens L is 0.45, the focal length of L will be equal to the LDAC beam dimension at slow axis (for example, 10 mm for a typical commercial LDAC). If the LDAC's are like LDAC1, the focal spot dimension at the slow axis is 1.7 mm. If the LDAC has ten prisms (or wedges) for beam dividing and ten prisms (or wedges) for beam rearranging, such as in LDAC3 and LDAC4, the spot dimension will decrease to 0.17 mm. Because of the beam divergence at fast axis is very small (typically 1 mrad), another dimension of focal spot is less than 0.01 mm. In this case, the distance between LDAC and L can be small and relay system is less important. But, with three LDAC's, only low power can be achieved.

Figure 18:
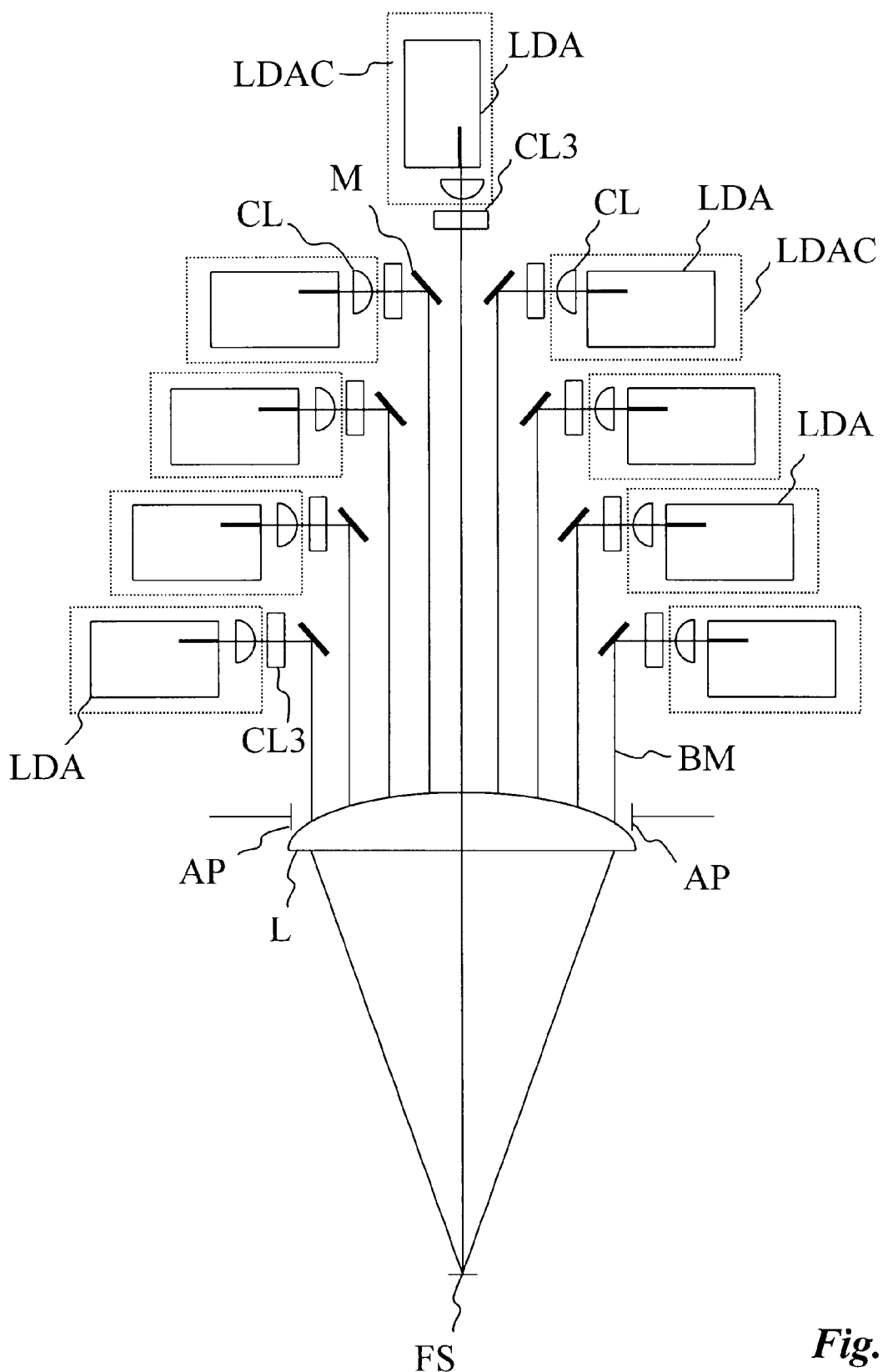
FIG. 18 is a schematic illustration for a combination of nine LDAC's.
Figure 19A:
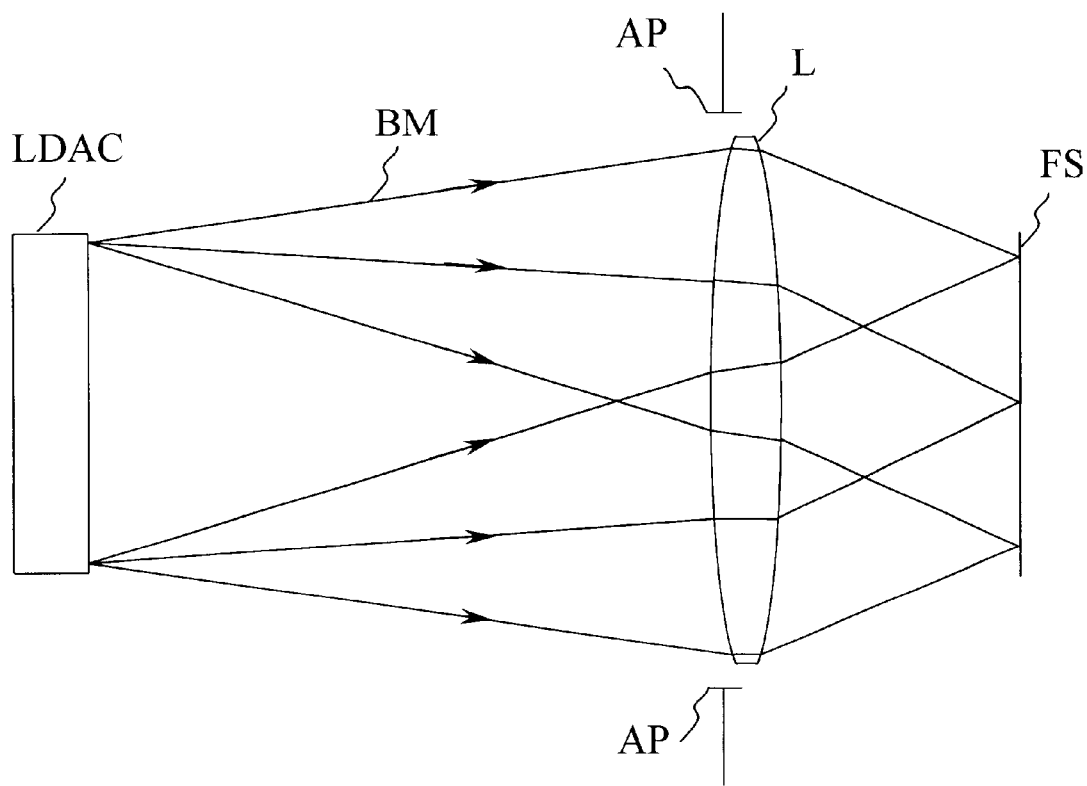
FIG. 19(a) is a schematic illustration showing that without a relay, much larger dimension of the beams at the slow axis will be obtained.
Figure 19B:
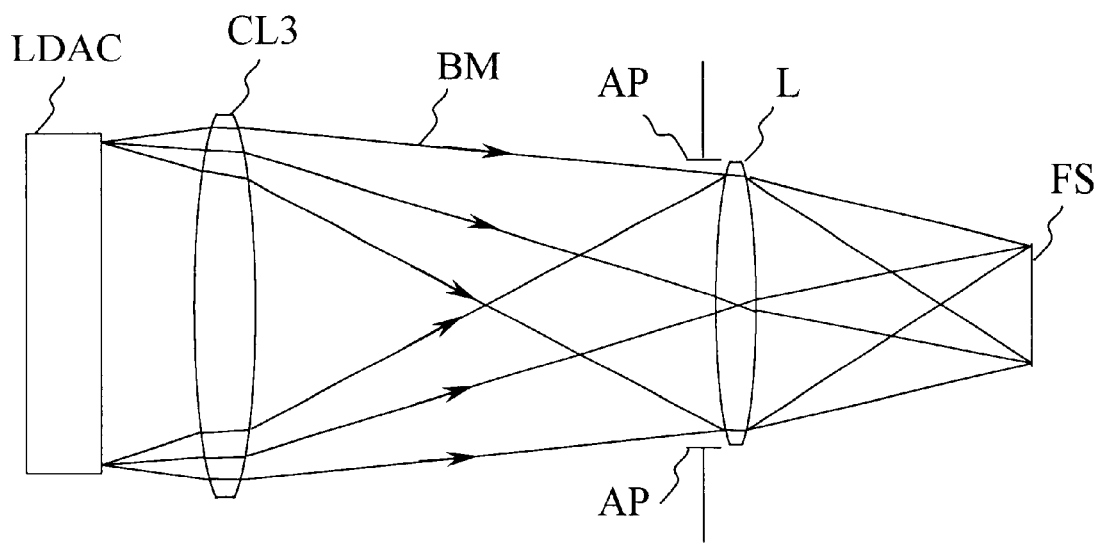
FIG. 19(b) is a schematic illustration showing the improvement achieved with a relay system.

Referring to FIG. 18, there is shown in schematic illustration a combination of nine laser diode array modules. Each LDAC is collimated at fast axis. When there is no relay system, after the reflection from the small mirrors M, the nine parallel laser beams are focused by lens L to a common focal spot FS. If the beam aperture at the fast axis is 0.8 mm, the combined beam aperture at AP will be 7.2 mm. Since the distance from LDAC to L can not be made small and may be even larger than 50 mm, this will cause a too large dimension of the beams at the slow axis as shown in FIG. 19(a). It is necessary therefore to use a relay cylindrical lens CL3 with an LDAC to form a laser diode array module as shown in FIG. 19(b). In this module, it is preferred that CL3 is substantially close to the LDAC, and the focal length is substantially equal to distance to aperture AP. If the NA at FS is 0.45, the spot dimension at slow axis is the same as the previous 3-LDA case, the spot dimension at the fast axis will be slightly larger than 0.01 but still very small.

Because the beam dimension at the fast axis and at the slow axis are different at the position AP, and because the position of the "object" is also different, lens L can be replaced with two cylindrical lenses having different focal lengths at different positions. However, in some special designs, single spherical lens still can be used as L. In addition, although NA of a beam at FS is limited as 0.45, the angle between the beam and the FS plane could exceed the value determined by NA since optical path is not telecentric. This is shown in FIG. 19(b). In other words, telecentric relay is more preferred.

From the above two examples, it can be seen that in order to combine the beams from a plurality of LDAC's into a single aperture AP, the use of laser diode array modules is necessary to achieve small focal spot. With the addition of the beam dividing and rearranging device, the beam quality can be further improved. With laser diode array modules, beams can transmit in long distance with substantially the same brightness and keep being telecentric. The advantages of laser diode array modules therefore are obvious.

Figure 20A:
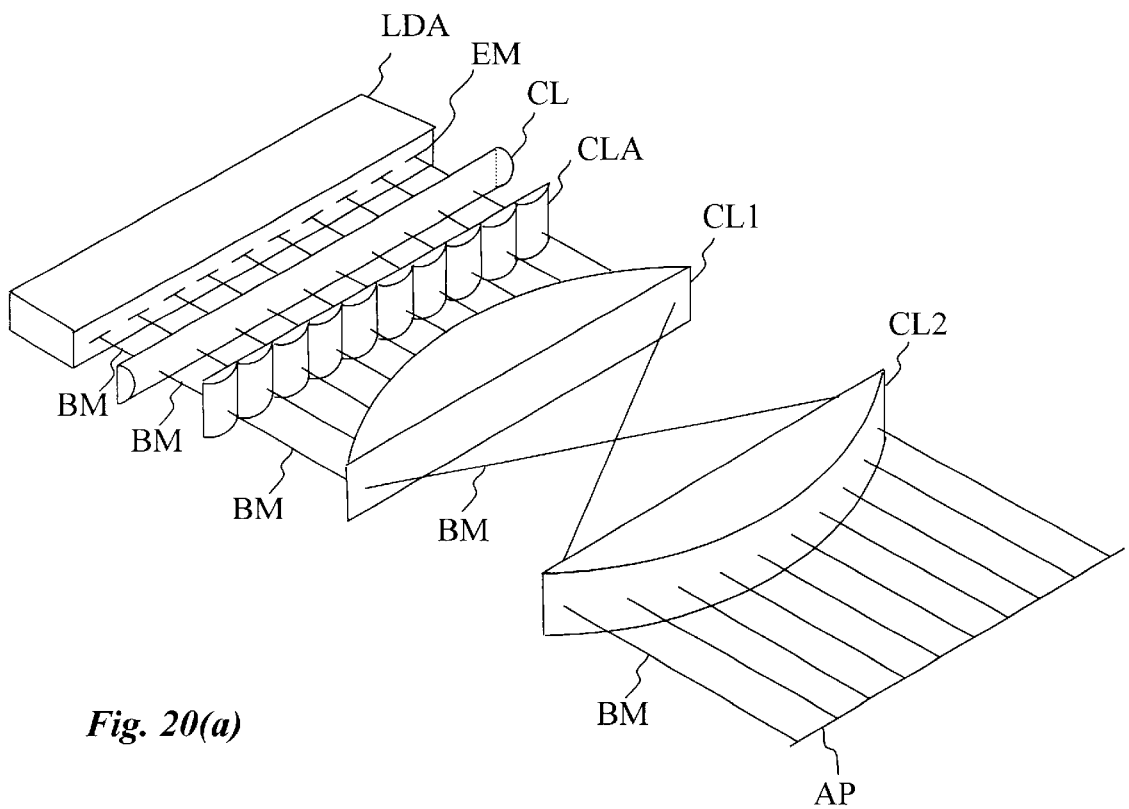
FIG. 20(a) is a schematic illustration showing an example of a laser diode array module used for multiple laser diode array pumping, with the side view in FIG. 20(b) showing that beam dimension can be kept the same for a very long distance.
Figure 20B:
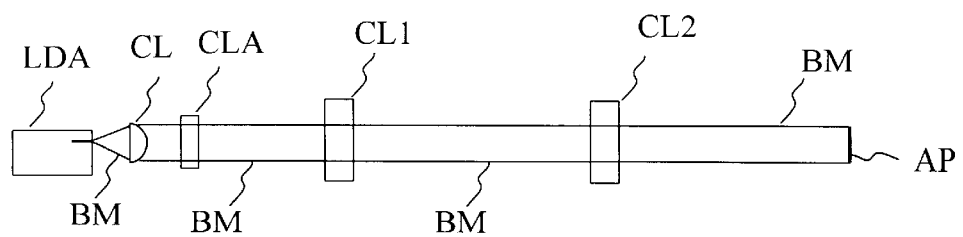
FIG. 20(c) is a schematic drawing showing a 4f telecentric relay with a magnification of 1:1, comprising cylindrical lens CL1 and CL2.
FIG. 20(d) is a schematic illustration showing a cylindrical telecentric relay for a laser diode array module with a non-1:1 magnification.
Figure 20C:
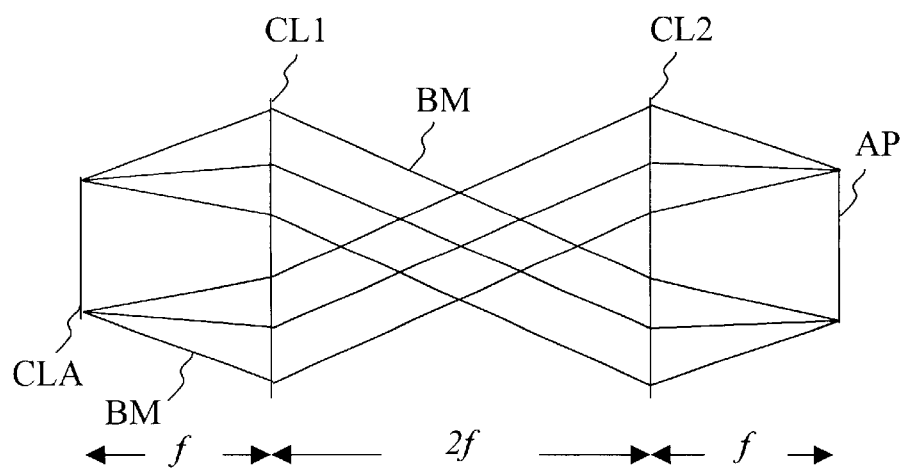

Referring to FIG. 20(a), there is shown in schematic illustration an example of a laser diode array module used for multiple laser diode array pumping. In this example, the laser diode array has multiple emitters EM. The laser beams from the emitters EM are collimated by the cylindrical lens CL at fast axis. In general, the laser beam at the fast axis is diffraction limited. The beam dimension can be kept the same for a very long distance (such as 800 mm within 0.8 mm), as schematically illustrated in FIG. 20(b) (side view). A cylindrical lens array CLA is also disposed in the front of the laser diode array. Each micro-cylindrical lens of CLA collimates the beam from each emitter segment, respectively, at the slow axis, and allows each laser beam to fill each micro cylindrical lens aperture at the slow axis. Although the laser beam is collimated by CLA, the divergence angle can still be larger than 5° at the slow axis. This means that, after the transmission of 800 mm. the beam cross section will become 80 mm if the starting dimension is 10 mm. As an example, a telecentric optical system can be used as the large distance relay. If this telecentric relay is a 4f system with a magnification of 1:1, comprising cylindrical lens CL1 and CL2 as shown in FIGS. 20(a) and 20(c), the divergent beam BM from CLA is collimated by CL1 and focused by CL2 at aperture AP. In FIG. 20(c), f is the focal length of CL1 and CL2. The laser beam dimension including the divergence angle at AP is the same as it leaves from CLA.

Therefore, with laser diode array modules, laser beam can transmit a long distance, such as 1 m or longer, and still substantially preserve the brightness as from the LDAC, and concentrate at small area on AP. With laser diode array modules, it becomes not critical whether the beam from a LDAC is substantially collimated or not. The dimension of beam from a LDAC can be kept substantially the same after a long distance transmission.

Figure 20D:
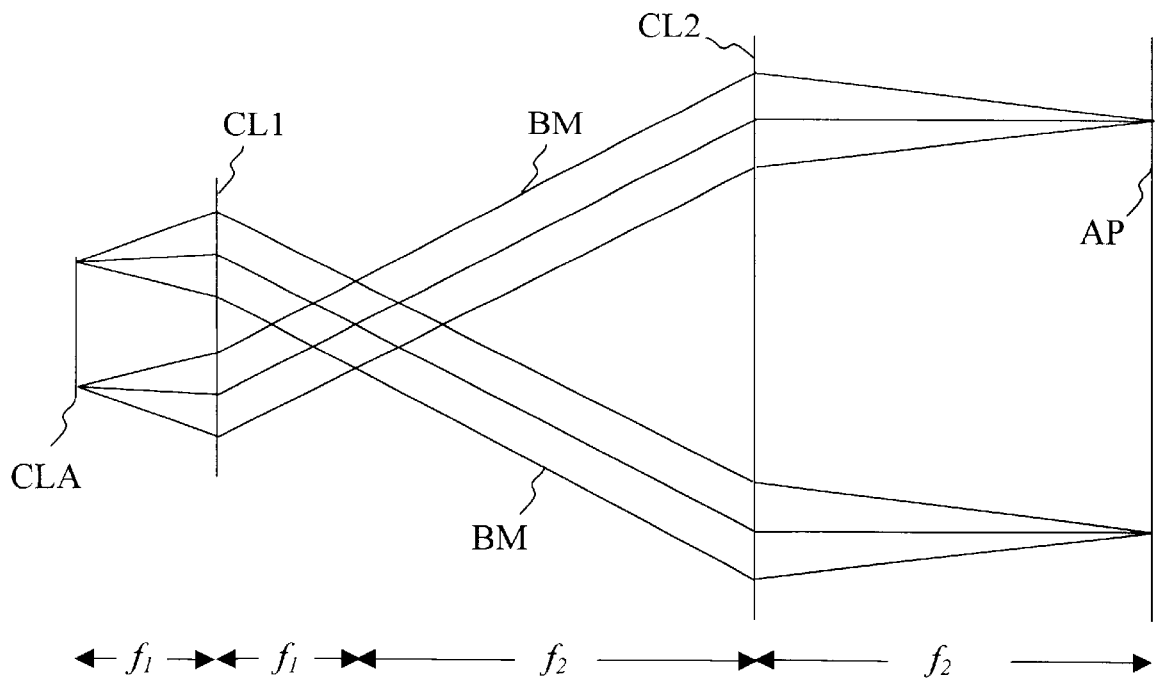

FIG. 20(d) shows a cylindrical telecentric relay for a laser diode array module with a non 1:1 magnification, wherein $f_1$ and $f_2$ is the focal length of CL1 and CL2, respectively. Since the magnification is variable ($f_2/f_1$), the image dimension of the laser diode array at AP is variable at the slow axis, so that it is possible to make the laser beams have substantially the same dimensions at the slow axis and at the fast axis.

Referring to FIGS. 20(a)–(b), if there is no cylindrical lens array CLA in front of the LDA, the divergence angle at slow axis will be lager than 5°. But the relay systems disclosed before also can be used to transmit laser beam for a long distance and still preserve the beam brightness.

Figure 21A:
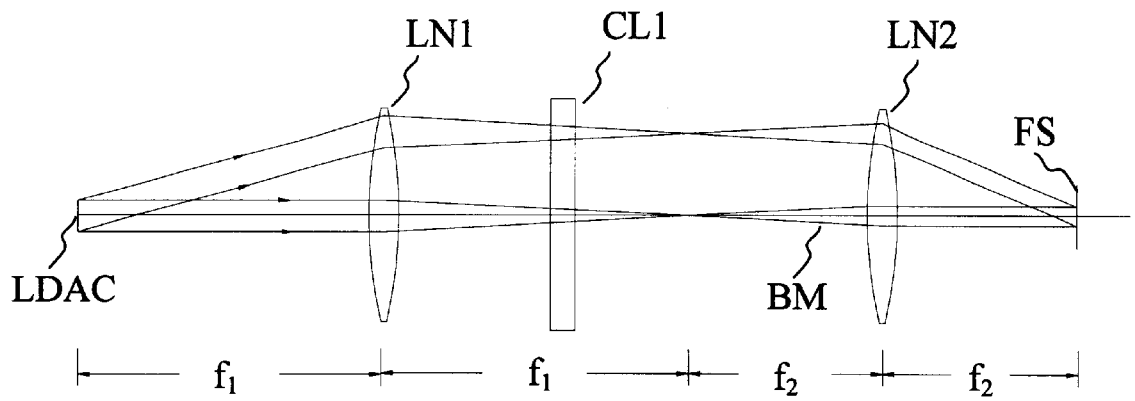
FIG. 21(a) shows the use of telecentric relay to form the image of LDAC directly at the end-surface aperture of a fiber.
Figure 21B:
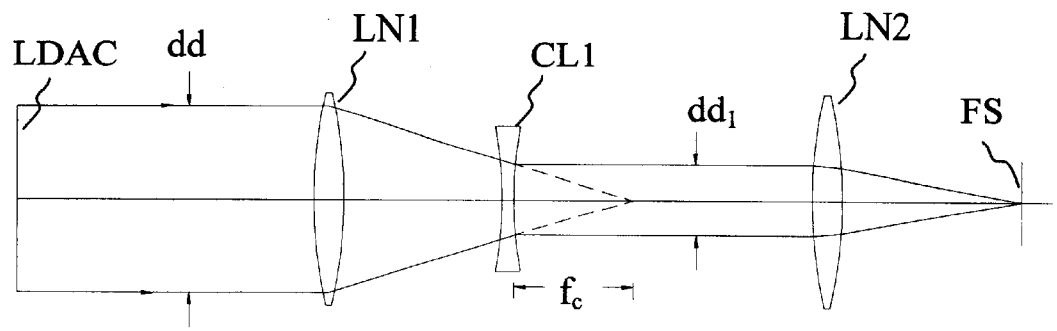
FIG. 21 (b) is another view of FIG. 21 (a).
FIG. 21(c) shows another example of using telecentric relay, where the beam can be focused by lens LN2 directly when the first lens is cylindrical lens CLN with a focal length $f_r$.
Figure 21C:
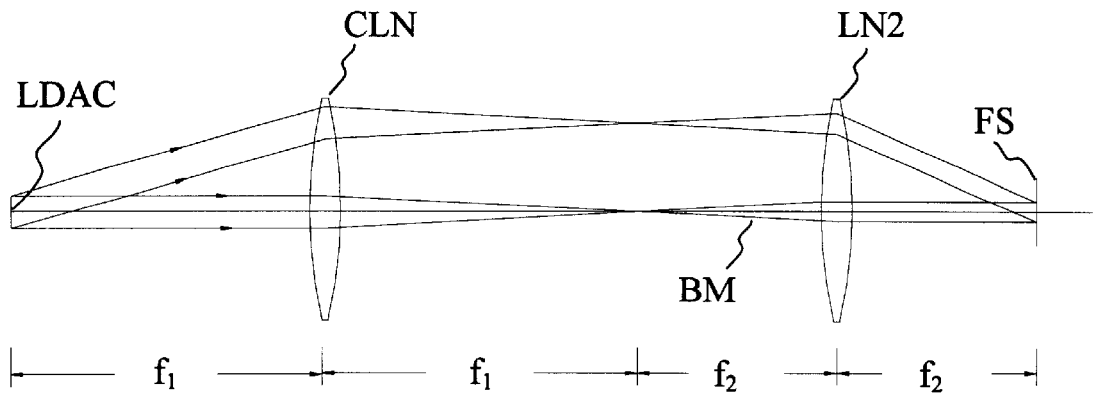
Figure 21D:
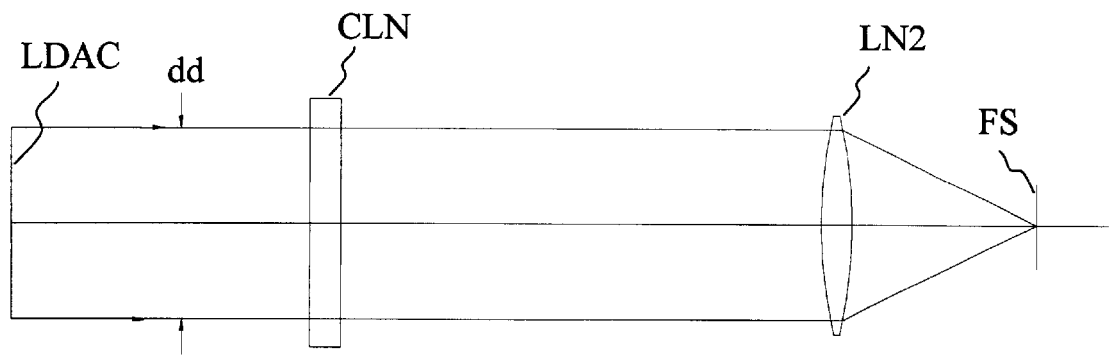

FIGS. 21(a)–(d) show another two spherical lens telecentric relays for a laser diode array module, where FIGS. 21(b) and (d) are the vertical views of FIGS. 21(a) and (c), respectively. These two systems are similar to the system shown in FIGS. 20(a)–(b), but cylindrical lenses CL1 and CL2 are replaced with spherical lenses. The beam at the fast axis can transmit in long distance not because they are close to be parallel, but because of the relay. In this case, the magnification at the slow axis and fast axis is the same, We can use telecentric relay to form the image of LDAC directly at the end-surface aperture of a fiber rather than at the lens aperture, as shown in FIGS. 21(a) and 21(c), where the focal spot FS coincides with the end surface aperture (AP) of the fiber. The magnification ($f_2/f_1$) is determined by the requirement to the image size (or image NA) at slow axis. If the NA at the focal spot FS is 0.45, with LDAC1 LDAC3 and LDAC4, $f_2/f_1$ is 1/5.17 since the slow-axis divergence is 10° (NA 0.087). For LDAC8 (NA 0.025), $f_2/f_1$ is 1/18. The magnitude of $f_1$ is variable and can be chosen for easy realization. In these two systems, the beam from LDAC is collimated at fast axis as shown in FIGS. 21(b) and 21(d). The beam can be focused d by lens LN2 directly when the first lens is cylindrical lens CLN with a focal length $f_1$, [FIGS. 21(c) and (d)]. The beam width dd of LDAC at fast axis is unchanged through CLN to LN2. For system shown in FIGS. 21(a) and (b), the beam width can be shrunken to $dd_1=dd*(f_c/f_1)$ by lens LN1 and cylindrical lens CL4.

Figure 22:
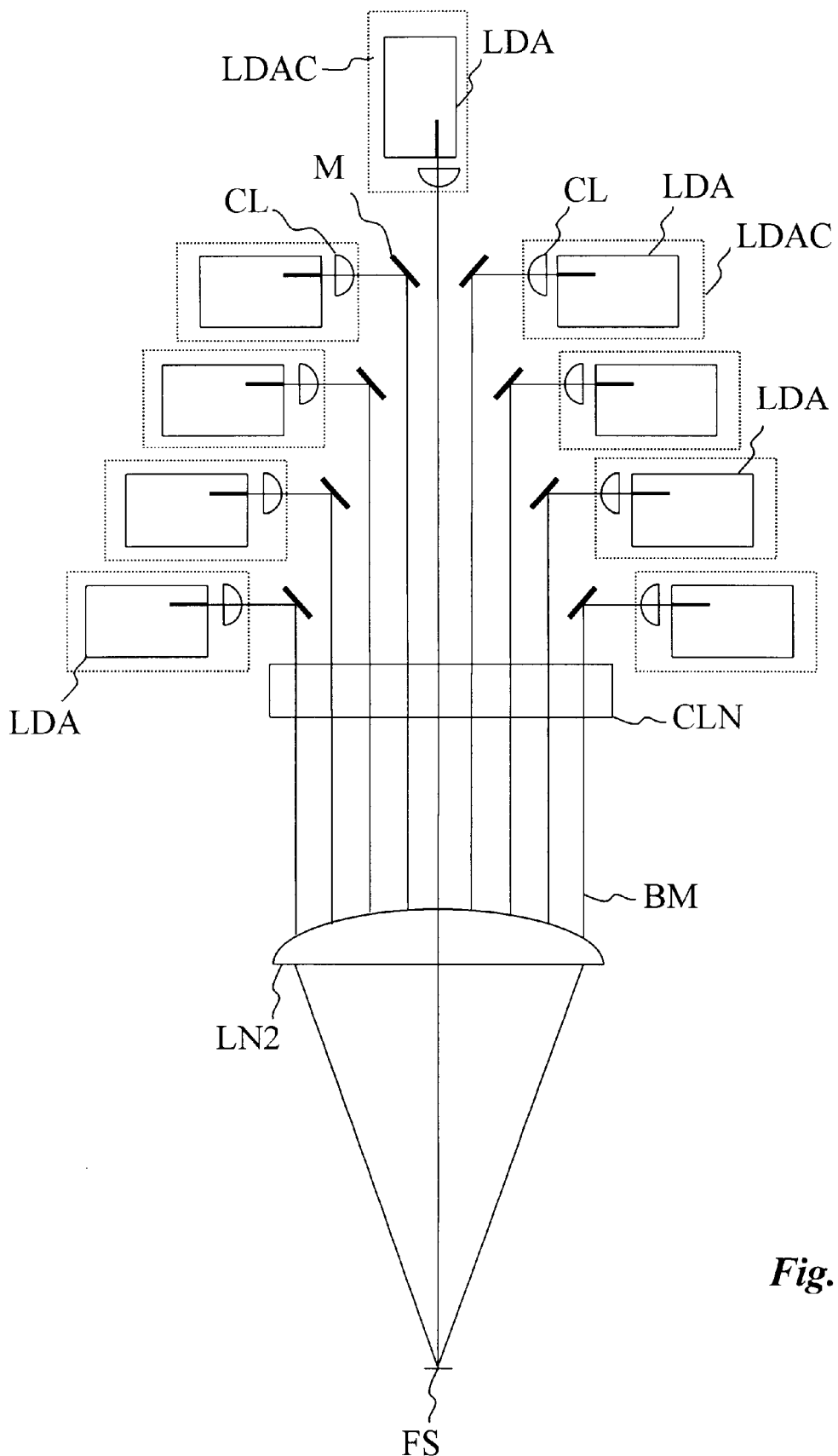
FIG. 22 is schematic illustration for another combination of nine LDAC's using telecentric optical system of FIG. 21(c).

FIG. 22 shows a combination of nine LDAC's by using the telecentric optical system of FIG. 21(c). The system is simpler than the one in FIG. 18. If the system in FIG. 21(a) is used, the system is also smaller due to the shrunken aperture ($f_c/f_1$).

4. Combination of multiple laser diode array modules

Figure 23:
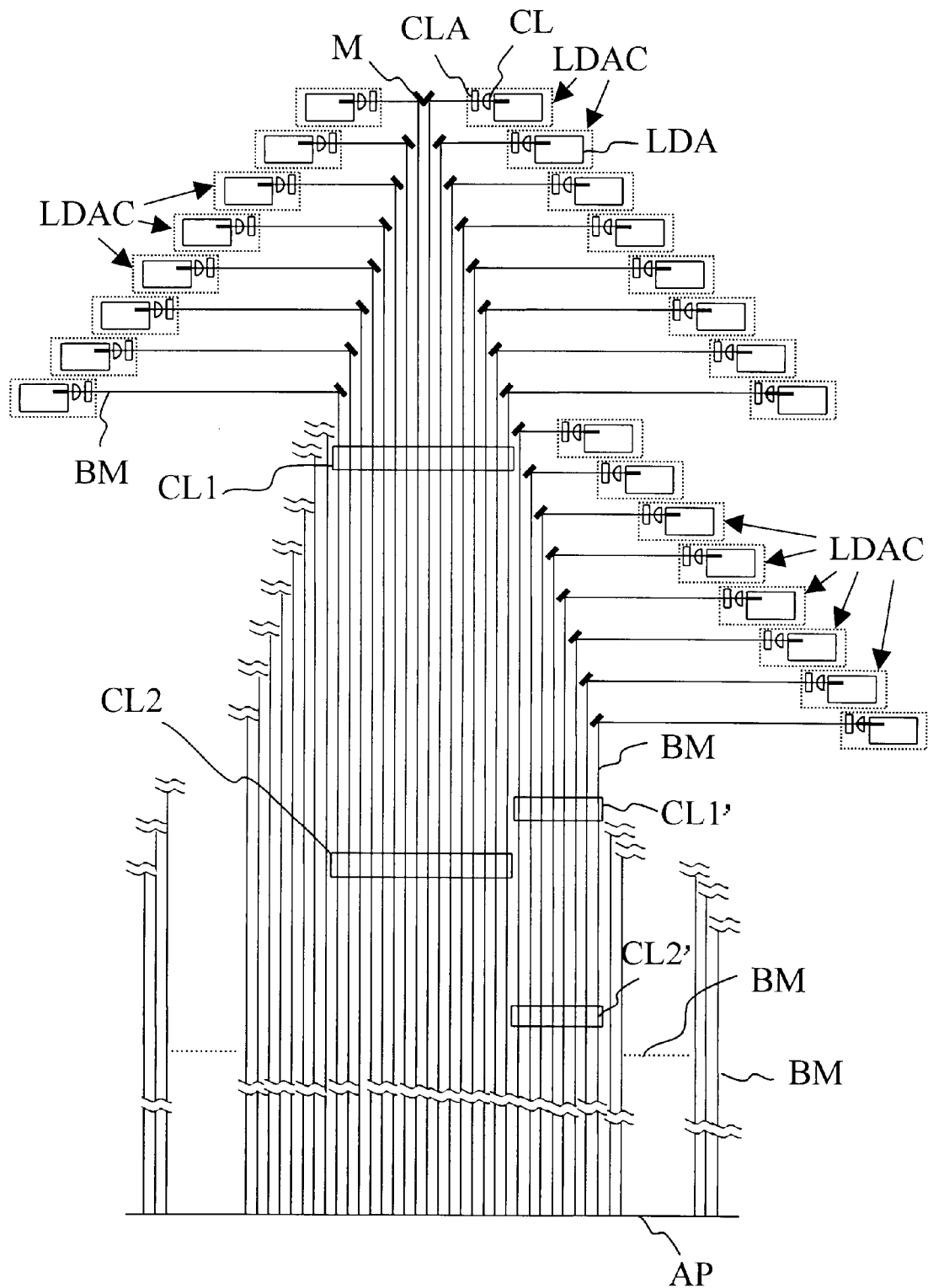
FIG. 23 is a schematic illustration partially showing the combination of multiple laser diode array modules wherein the components are not in proportion, and many components and light beams are not shown for easy understanding.

We can combine multiple laser diode array modules as shown in FIG. 23, where LDA's are laser diode arrays with heat sinks. Each LDAC comprises an LDA, a cylindrical lens CL and a cylindrical lens array CLA. Assuming the thickness of each LDAC is 10 mm, and the distance between each LDAC is larger than 10 mm for thermal management. If there are 50–100 pieces of LDAC's at one side of the aperture AP, the largest distance from LDA to AP may be as much as 500–1000 mm. Using relays to form modules as mentioned above, the laser beams from all the laser diode array modules can be projected onto AP. In the figure, M's are small mirrors that direct the laser beams from LDA to the aperture AP in parallel.

The LDAC s in FIG. 23 can be divided into several groups if preferred. Therefore, although the distances of each LDAC could be different from the other, each group can be made to have the same total distance to AP. In this case one set of large telecentric relay lens (CL1 and CL2, or CL1' and CL2') will be enough for each group. Thus in this example, one module comprises a plurality of LDAC's and one set of relay system.

With the scheme in FIG. 23, the dimension of laser beams at the fast axis from the laser diode array modules can be kept substantially constant over a long distance. The center to center distance at the fast axis between beams is just equal to the beam dimension at the fast axis. Therefore, if the dimension of each laser beam is 0.8 mm at the fast axis, the total dimension at the fast axis for laser beams from 200 pieces of laser diode array modules will be about 160 mm at AP.

By using cylindrical lens to focus the beam at the fast axis into a beam of NA 0.45, the aperture of the lens is equal to the focal length. When f=160, the dimension of the focal spot at the fast axis will be 0.116 mm since the divergence angle of the beam is 0.001 rad. If a 4f 1:1 relay is used in the laser diode module, the aperture in the other direction will still be 10 mm. By focusing with cylindrical lens having f=10, the dimension of the focal spot at the slow axis will be 0.5 for LLAC3.

If the non 1:1 telecentric relay shown in FIG. 20(d) is used, the aperture at the slow axis can be 160 mm and the divergence angle demagnified to 1/16. A spherical lens can then be used to focus the beams into NA 0.45, and the focus spot dimension is the same as before, Using the telecentric relay as shown in FIGS. 21 (a)–(d) to combine 200 or more LDAC can also be realized. When choosing $f_2$=160 for a large aperture h NA 0.45 and $f_1$=827 for LDAC1, LDAC3 or LDAC4, the space between CLN and LDAC (FIG. 22) is large enough for 200 LDAC'S.

Using this system for LDAC5 and LDAC2, the focal length ($f_1$) of CLN is 2880. If CLN is a single cylindrical lens, the space will be too large for 200 LDAC. It is better in this case to use telephoto structure to shrink the space. In fact, this space can be shrunk simply by making the system to be substantially, telecentric.

With the components described above, a high-efficiency fiber laser can be obtained, comprising at least one laser diode array module, a laser fiber with its core doped with active species, and an imaging optical system, wherein said imaging optical system is disposed between said module and the aperture of said fiber and focuses the beam from said module onto the aperture of said laser fiber. Said laser diode array module includes means for beam dividing and rearranging. Said imaging optical system can include lens and mirrors. For high-power fiber lasers, a plurality of said modules are used. If desired, more than 200 modules can be used. It is preferred that there is a symmetry-broken inner cladding or a multiple-imaging cladding surrounding the core of said laser fiber. Said symmetry-broken cladding can be a symmetry-broken circular cladding, a symmetry-broken rectangular cladding, or other symmetry-broken cladding. Said multiple-imaging cladding can be a rectangular-like multiple-imaging cladding or other multiple-imaging cladding. Said laser diode array module is a system comprising at least one laser diode array, a collimating structure, and at least one optical relay system. It is preferred that said optical relay system is a telecentric relay including at least one cylindrical lens.

It is obvious to the skilled in the art, with the same principle, the methods described above can also be used for pumping solid-state laser rods. This can be easily realized if the laser fiber described above is replaced with a laser rod. Of course, it is preferred if the rod dimension substantially equal to or larger than the beam dimension from these systems. Therefore, a high-efficiency diode-pumped solid state laser can be made, comprising at least one laser diode array module, a laser rod doped with active species such as rare-earth or transition metal ions like Nd, Yb, Er, Pr, and so on, and an imaging optical system, wherein said imaging optical system is disposed between said module and the aperture of said laser rod and focuses the beam from said module onto the aperture of said laser rod. Said imaging optical system can include lens and mirrors. For high-power diode-pumped solid state lasers, a plurality of said modules are used. If desired, more than 200 modules can be used. Said laser diode array module is a system comprising at least one laser diode array, a collimating structure including means for beam dividing and rearranging, and at least one optical relay system. It is preferred that said optical relay system is a telecentric relay including at least one cylindrical lens.

These methods and systems described above can also be use d for transmission of power from laser diode arrays through an optical fiber. High power can be transmitted because the method disclosed above allowing high efficiency in coupling laser power from a plurality of laser diode arrays into an optical fiber. The high power transmitted in the optical fiber can then be used, for instance, for material processing and medical surgery directly. Therefore, an apparatus for laser beam transmission using an optical fiber can be made, comprising an optical fiber for laser transmission, at least one laser diode array module, and an imaging optical system, wherein said imaging optical system is disposed between said module and the aperture of said fiber and focuses the beam from said module onto the aperture of said optical fiber, and wherein said laser diode array module comprises at least one laser diode array, a collimating structure including means for beam dividing and rearranging, and an optical relay system. Said imaging optical system can include lens and mirrors. For high power transmission, a plurality of said modules are used. It is preferred that said optical relay system is a telecentric relay including at least one cylindrical lens.

The foregoing descriptions of embodiments of the invention have been presented for the purpose of illustration and description. It is not intended to limit the invention to the precise form disclosed, and obviously many modification and variation are possible in light of above teaching. For example, LDAC using LDA stacks including beam dividing and rearranging device and collimating structures can be used together with a relay system so that multiple stacks can be combined in ah similar way as shown in FIG. 23. Also, multiple lenses can be used as the relay system at the slow axis for a brightness substantially-conserved laser diode array module Multiple relays can also be used in cascade, The embodiments were chosen and described order to best explain the principles of the invention and its practical applications to the. enable others skilled in the art to best utilize the present invention. While specific values have been used and listed in the foregoing embodiments for the sake of easy to understand, they do not set limit on the invention teaching, which is properly described in the claims. The particular values and configurations discussed above can be varied and are cited merely to illustrate particular embodiments of the present invention and are not intended to limit the scope of the present invention.

What is claimed is:

1. An apparatus for beam shaping of laser diode array, comprising:
    at least one laser diode array having an emitting surface, the emitting surface being substantially more elongated, in a slow axis than in a fast axis which is perpendicular to the slow axis;
    beam dividing/rearranging means, comprising:
    at least one prism group comprising a plurality of adjacent stacked prisms with lateral edges being altitudes of the prisms, the adjacent stacked prisms having predetermined uniform offsets between the adjacent stacked prisms,
    the beams from said laser diode array entering the prism group from one stacked side and divided into a plurality of sections of beams along the slow axis and the sections of beams are displaced along their fast axis and overlie one another whereby the Lagrange invariant of a resulting beam is increased approximately by n-fold in the fast axis and reduced approximately by n-fold in slow axis.

2. An apparatus of claim 1, further including:
    a collimation means disposed between said laser diode array and said beam dividing/rearranging means, wherein said collimation means collimates the laser beams from said laser diode array.

3. An apparatus of claim 1, wherein:
    said beam dividing/rearranging means includes:
    two prism groups comprising a plurality of 45°–90° right prisms.

4. An apparatus of claim 1, wherein said beam dividing/rearranging means includes:
    two prism groups comprising a plurality of refraction prisms, wherein the beam dividing/rearranging is accomplished when the laser beams from said laser diode array pass through said two prism groups.

5. An apparatus of claim 1, wherein:
    the unused corners of said prisms are removed.

6. An apparatus of claim 1 further including:
    a beam shrinking means, wherein said laser diode array is a two dimensional laser diode array stack and the laser beams from said laser diode array are shrunk by said beam shrinking means before dividing and rearranging.

7. An apparatus of claim 1, wherein:
    said-beam dividing/rearranging means comprising at least one prism rod groups.

8. An apparatus of claim 1, wherein:
    a projected emitter line of the laser beams of said laser diode array on the incidence surfaces of the prism group forms a predetermined angle with the base of the prisms.

9. A laser beam shaping system comprising:
    a laser diode array having an emitting surface in an emission plane, the emitting surface being substantially more elongated in a slow direction than in a fast direction which is perpendicular to the slow direction;
    a plurality of adjacent stacked prisms with lateral edges being altitudes of the prisms, each of the plurality of adjacent stacked prisms being located at increasing distances from the emitting surface;
    the laser diode array being inclined with respect to the base of the prisms;
    whereby the emitting surface is segmented into beam segments along the slow axis by each prism with the beam segments being made to overlying one another in the fast axis.

10. A laser beam shaping system comprising:
    a laser diode array having an emitting surface in an emission plane, the emitting surface being substantially more elongated in a slow axis than in a fast axis which is perpendicular to the slow axis;
    a first plurality of adjacent prisms with a predetermined offset, each prism of said first plurality of adjacent prisms having at least one lateral surface for incident and exit beams and two lateral surfaces for beam reflection and the beam paths in each adjacent prisms having the same length;
    a second plurality of adjacent prisms with a predetermined offset, each prism of said second plurality of adjacent prisms having at least one lateral surface for incident and exit beams and two lateral surfaces for beam reflection and the beam paths in each adjacent prisms having the same length;

the second plurality of adjacent prisms placed at right angles to the first plurality of prisms;

whereby the emitting surface is segmented into beam segments along the slow axis and offset in the fast axis by each of the plurality of first prisms with the beam segments being made to overlying one another in the fast axis by the second plurality of prisms.

11. An apparatus for beam shaping of laser diode array, comprising:

a laser diode array having an emitting surface being substantially more elongated in a slow axis than in a fast axis which is perpendicular to the slow axis;

beam dividing/rearranging means;

wherein said beam dividing/rearranging means comprises:

one plate group comprising a plurality of optical plates for dividing and rearranging said beams, in which said optical plates are stacked with a predetermined offset, the optical plates of the plate group aligned with respect to the beams from said laser diode array to enter the optical plates from one stacked side with the projected slow axis of the laser beam of said laser diode array on the plate group forms a predetermined angle with the bases of the optical plates, whereby said laser beams are divided in a plurality of beam sections along the slow axis and the beam sections are rearranged along the fast axis so that the Lagrange invariant of the resulting beam increased approximately by n-fold in fast axis and reduced approximately by n-fold in slow axis.

12. An apparatus of claim 11, further includes:

collimation means disposed between said laser diode array and said beam dividing/rearranging means, wherein said collimation means collimates the laser beams from said laser diode array.

13. An apparatus of claim 11, wherein:

said optical plates are rectangular and are of different sizes, wherein the laser beams from said laser diode array enter each said plates in said plate group from the same incidence angle with respect to the incidence surfaces.

14. An apparatus of claim 11, wherein:

said optical plates are rectangular and are of the same sizes, stacked with a predetermined radial offset, wherein the laser beams of said laser diode array enter each said plates of said plate group from a different incidence angle with respect to the incidence surfaces.

15. An apparatus of claim 11, wherein:

said optical plates are optical wedges wherein the laser beams from said laser diode array enter each said optical wedge from the same incidence angle with respect to the incidence surfaces.

16. An apparatus of claim 11 further including:

a beam shrinking means, wherein said laser diode array is a two dimensional laser diode array stack and the laser beams from said laser diode array is shrunk by said beam shrunken means before dividing and rearranging.

17. A laser beam shaping system comprising:

a laser diode array having an emitting surface in an emission plane, the emitting surface being substantially more elongated in a slow axis than in a fast axis which is perpendicular to the slow axis;

a plurality of deflection plates defining a single plate group, each plate having parallel entrance and exit surfaces with the plates each defining an optical transmission path between the entrance and exit surfaces, the distance between entrance and exit surface increasing between respective adjacent plates of the single plate group; and, the entrance surfaces of the plates being aligned to the emission surface of the laser diode array with the slow axis of the emission surface of the laser diode array being inclined with respect to the plane of the top and bottom surfaces of the plates;

whereby the emitting surface is segmented into beam segments along the slow axis by each plate with the beam segments being made to overlie one another along the fast axis.

18. A laser beam shaping system comprising:

a laser diode array having an emitting surface in an emission plane, the emitting surface being substantially more elongated in a slow axis than in a fast axis which is perpendicular to the slow axis;

a plurality of deflection plates defining a single plate group, each plate having parallel entrance and exit surfaces and defining an optical transmission path between the entrance and exit surfaces, the distance between the entrance and exit surfaces being constant between respective adjacent plates of the single plate group;

the entrance surfaces of the plates being aligned to the emission surface of the laser diode array with the slow axis of the emission surface of the laser diode array being inclined with respect to the plate of the top and bottom surfaces of the plates;

each entrance surface of each plate having a differing and relative increasing angularity with respect to the emitting line of the laser diode array;

whereby the emitting surface is segmented into beam segments along the slow axis by each plate with the beam segments being made to overlie one another along the fast axis.

19. An apparatus for beam dividing and rearranging of laser diode array, comprising:

a laser diode array having an emitting surface in an emission plane, the emitting surface being substantially more elongated in a slow axis than in a fast axis which is perpendicular to the slow axis;

beam dividing/rearranging means, comprising a single array of mirrors including plurality of parallel arrayed mirrors that are spaced with a predetermined offset, a apparent emission plane substantially perpendicular to the emission plane in which the laser diode emitter lies;

the beam dividing and rearranging means orient with respect to the laser beams of said laser diode array to be intercepted by said mirrors at different location sequentially due to said offset between said mirrors, the plurality of mirrors inclined with respect to the slow axis of said laser diode array to strike on said mirrors with an inclination angle relative to the slow axis the dimension of the resulting beams after said mirrors substantially equals to n*BD, where n is the number of mirrors and BD is the fast axis beam width of the, laser beams before said mirrors, whereby the Lagrange invariant of the resulting beam increased approximately by n-fold in fast axis and reduced approximately by n-fold in slow axis.

20. A laser beam shaping system comprising:
- a laser diode array having an emitting surface in an emission plane, the emitting surface being substantially more elongated in a slow axis than in a fast axis which is perpendicular to the slow axis;
- an apparent emission plane having an apparent reoriented emitting surface;
- a first surface for reflecting a first segment of the laser diode array, the first reflecting surface in a first plane including parallel lines, each parallel line parallel to the emission plane and the apparent emission plane;
- the first deflection plane inclined about the parallel lines so as to have angularity with respect to both the emission plane and the apparent emission plane;
- at least a second deflecting surface for deflecting a second adjacent segment of the laser diode array, the second deflecting surface in a second deflection plane parallel to but not co-incident with the first deflection plane;
- the light path length between the emitting surface, the second reflection plane and the apparent emitting surface being of a length relative to the light path between the emitting surface, the first reflection plane; and the apparent emitting surface
- whereby the reoriented apparent emitting surface is segmented in the fast axis with the segments overlying one another in the slow axis.

* * * * *